US005302543A

United States Patent [19]

Sakakibara

[11] Patent Number: 5,302,543

[45] Date of Patent: Apr. 12, 1994

[54] METHOD OF MAKING A CHARGE COUPLED DEVICE

[75] Inventor: Kiyohiko Sakakibara, Itami, Japan

[73] Assignee: Mitsubishi Denki Kabushiki Kaisha, Tokyo, Japan

[21] Appl. No.: 981,846

[22] Filed: Nov. 25, 1992

Related U.S. Application Data

[62] Division of Ser. No. 608,387, Nov. 2, 1990, Pat. No. 5,189,498.

[30] Foreign Application Priority Data

| | | | |
|---|---|---|---|
| Nov. 6, 1989 | [JP] | Japan | 1-289029 |
| Mar. 22, 1990 | [JP] | Japan | 2-74024 |
| Jun. 22, 1990 | [JP] | Japan | 2-153399 |
| Jul. 31, 1990 | [JP] | Japan | 2-204505 |

[51] Int. Cl.[5] .......... H01L 21/76

[52] U.S. Cl. .......... 437/53; 437/30; 437/979

[58] Field of Search .......... 437/27, 28, 30, 50, 437/53, 147, 148, 149, 150, 247, 954, 931, 979; 148/DIG. 3, DIG. 157, DIG. 163

[56] References Cited

U.S. PATENT DOCUMENTS

| | | | |
|---|---|---|---|
| 3,763,480 | 10/1973 | Weimer | 257/249 |
| 3,918,997 | 11/1975 | Mohsen et al. | 437/53 |
| 3,921,194 | 11/1975 | Engeler et al. | 357/241 |
| 4,035,906 | 7/1977 | Tasch et al. | 437/53 |
| 4,065,847 | 1/1978 | Borel et al. | 437/53 |
| 4,216,574 | 8/1980 | Feist | 437/50 |
| 4,694,316 | 9/1987 | Chabbal | 257/231 |
| 4,742,016 | 5/1988 | Rhodes | 437/53 |

FOREIGN PATENT DOCUMENTS

| | | | |
|---|---|---|---|
| 0384286 | 8/1990 | European Pat. Off. . | |
| 0026587 | 3/1978 | Japan | 437/28 |
| 57-20473 | 2/1982 | Japan . | |
| 62-104077 | 5/1987 | Japan . | |
| 1-38757 | 5/1989 | Japan | 437/53 |
| 1-300561 | 12/1989 | Japan . | |

*Primary Examiner*—Tom Thomas
*Assistant Examiner*—C. Chaudhari
*Attorney, Agent, or Firm*—Leydig, Voit & Mayer

[57] ABSTRACT

A charge coupled device includes a second conductivity type first horizontal channel in a first conductivity type semiconductor substrate, a second conductivity type second horizontal channel in the substrate at a predetermined distance from the first horizontal channel, and a second conductivity type transfer channel connecting the first horizontal channel with the second horizontal channel to enable transfer of charges from the first horizontal channel to the second horizontal channel. The pinning potential of the transfer channel is larger in absolute value than the pinning potential of the first and second horizontal channels, and the gate voltage pinning the transfer channel is smaller in absolute value than the gate voltage pinning the first and second horizontal channels. Therefore, the charges in the first horizontal channel can be transferred to the transfer channel by a gate voltage pinning the horizontal channel and the charges can be transferred from the first horizontal channel to the second horizontal channel by clock signals.

6 Claims, 23 Drawing Sheets

METHOD OF MAKING A CHARGE COUPLED DEVICE

This application is a division of application Ser. No. 07/608,387, now U.S. Pat. No. 5,189,498 filed Nov. 2, 1990.

FIELD OF THE INVENTION

The present invention relates to a charge coupled device (hereinafter referred to as CCD) for inputting charges in parallel and outputting charges in series.

BACKGROUND OF THE INVENTION

Recently, devices utilizing CCDs, such as analog memories, solid state imaging elements and delay lines, have been extensively developed. In the device construction thereof, it is the most important theme on design to incorporate CCDs having multiple stages on a relatively small chip. Particularly, a construction of a so-called parallel/serial conversion part which receives the charges transferred as input in parallel and outputs the same in serial raises a problem for high density integration.

However, in order to solve these problems in construction, a device in which a plurality of serial transfer CCDs are provided to relax the pitch interval, thereby resulting in a high density integration is proposed.

FIGS. 20(*a*) and 20(*b*) show a plan view and a cross-sectional view of CCD in a case where such construction is adopted in a solid state imaging element of an interline transfer system, disclosed in such as Japanese Patent Publication No. Sho. 53-35437 or "A 2 Million Pixel FIT-CCD Image Sensor for HDTV Camera System", ISSCC DIGEST OF TECHNICAL PAPERS, pp. 214–215, February 1990.

In such a solid state imaging element, generally a serial transfer CCD is called as a horizontal CCD and a parallel transfer CCD is called as a vertical CCD. Therefore, these terms are used in the following description and the kind of CCD is a buried channel type.

In the conventional construction of FIG. 20(*a*), reference numeral 1 designates a photodiode arranged in a two-dimensional array. A transfer gate 2 for transferring the charges from the photodiode 1 to the vertical CCD channel 3 serving as a vertical channel is provided between the photodiode 1 and the vertical CCD channel 3. A final electrode 4 of the vertical CCD channel 3 is provided perpendicular to the vertical CCD channel 3 and is connected to the terminal $\phi$VL. Here, although a transfer electrode is provided for the transfer by the vertical CCD channel 3 besides the final electrode 4, it is not illustrated in the figure for simplification.

A horizontal CCD channel 5 serving as a first horizontal CCD channel is provided in connection with the vertical CCD channel 3. A horizontal CCD channel 6 serving as a second horizontal channel is provided in parallel with the first horizontal CCD channel 5. Reference numerals 7 to 10 designate transfer electrodes for transfer by the horizontal CCDs. The electrodes 7 and 8 are connected to a terminal H1 and the electrodes 9 and 10 are connected to a terminal H2. The potential wells below the electrodes 8 and 10 are shallower than those of the electrodes 7 and 9. These horizontal CCD channels 5 and 6 constitute a so-called two-phase driving system CCD.

A control gate 11 for controlling the charge transfer from the horizontal CCD channel 5 to the horizontal CCD channel 6 is connected to a terminal HT. Reference numeral 15 designates a transfer channel of a layer below the control gate electrode 11.

In the solid-state imaging element of FIG. 20(*a*), charges transferred from the vertical CCD channel 3 are transferred column by column to the respective horizontal CCD channels 5 and 6, and then the pitch interval $P_c$ of the horizontal CCD is matched with the pixel pitch interval $P_x$, in detail, $P_C=2P_X$, whereby the reduction in the pitch interval of horizontal CCD accompanying the increase in the pixel number is relaxed.

Next, a description is given of the operation of transferring the charges in the solid-state imaging element of FIG. 20(*a*) with reference to FIGS. 21 and 22.

FIGS. 21(*a*) to 21(*d*) show time charts of a clock pulse applied to each terminal in the construction of FIG. 20 for transferring charges. Pulses shown in FIGS. 21(*a*) to 21(*d*) are applied to each terminal $\phi$VL, H1, HT and H2.

FIG. 22(*a*) is a cross-sectional view taken along a line XII—XII of FIG. 20(*b*) the change of potential at times $t_1$ to $t_5$ is schematically shown in FIG. 22(*b*) to 22(*f*) and the transition of signal charges (shown by slash lines), and FIG. 22(*a*) shows electrodes 4, 9, 11 and 7 and terminals $\phi$VL, H2, HT and H1.

A description is given of the operation.

First of all, at time $t_1$, clock pulses applied to respective terminals $\phi$VL, H1 and H2 become all "H" level and charges are transferred from the vertical CCD channel 3 to opposite the electrodes 7 and 9 of the horizontal CCD channel 5. These respective charges are separated in the horizontal CCD channel 5 because of the potential barrier produced by the electrodes 8 and 10. Successively, at time $t_2$, the terminal HT becomes "H" level and the charges transferred to below the electrode 9 of the horizontal CCD channel 5 are transferred to the transfer channel 15 below the control gate electrode 11. Furthermore, at time $t_3$, the terminals $H_1$ and $H_2$ become "L" level and the charges are held in the transfer channel 15 below the control gate electrode 11. Then, at time $t_4$, the terminal $H_1$ again becomes "H" level and the charges in the transfer channel 15 below the control gate electrode 11 are transferred to below the electrode 7 of the horizontal CCD channel 6, and the whole transfer is completed at time $t_5$. Meanwhile, charges transferred to below the electrode 7 of the horizontal CCD channel 5 are kept there. In this way, in the construction of FIG. 20(*a*), the charges transferred from the vertical CCD channel 3 are transferred column by column into a potential well below the electrode 7 of the horizontal channels 5 and 6.

When the whole transfer is completed, the charges stored below the electrode 7 of the horizontal CCD channels 5 and 6 are transferred to the left direction in the horizontal CCD channels 5 and 6 by the two-phase clock signal applied to the electrode of the horizontal CCD channels 5 and 6 after $t_6$ (refer to FIGS. 21(*a*)–21(*d*), and they are output from the output part (not shown).

The conventional charge coupled device is constituted as described above, and the process for producing the electrodes 7 to 11 of the charge coupled device shown in FIG. 20 is as described in the following.

First, the control gate electrode 11 is produced and thereafter electrodes 7 and 9 are produced. Subsequently, ion implantation for establishing potentials in the channel regions in the horizontal CCD channels 5 and 6 are performed self-alignedly with the electrodes 7 and 9. Thereafter, electrodes 8 and 10 are produced.

Accordingly, in the conventional construction of FIG. 20(a), the electrode construction is a three-layer electrode structure comprising the control gate electrode 11, electrodes 7 and 9, and electrodes 8 and 10. Therefore, in a region where the control gate electrode 11 and respective electrodes 7 to 10 cross at right angles, the step differences of these electrodes become large, resulting in a likelihood of defects such as cutting of respective electrodes or short-circuiting between electrodes. These defects have caused reduction in the production yield of CCDs with respect to the production of these electrodes 7 to 10.

SUMMARY OF THE INVENTION

The present invention is directed to solving the above-described problems and has for its object to provide a charge coupled device and a production method therefor, for transferring charges into the horizontal CCDs with a double-layer electrode structure having no control gate electrode.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, in a charge coupled device, the pinning potential of the transfer channel is set deeper than that of the horizontal channel, and the gate voltage leading to the pinning of the transfer channel is set smaller in its absolute value than the gate voltage leading to the pinning of the horizontal channel.

According to a second aspect of the present invention, in a charge coupled device, the depth of the junction between a second conductivity type impurity layer serving as a transfer channel and a first conductivity type semiconductor substrate is set deeper than the depth of the junction between the second conductivity type impurity layers serving as first and second horizontal channels and the first conductivity type semiconductor substrate, and the impurity concentration of the second conductivity type impurity layer serving as the transfer channel is set lower than the impurity concentration of the second conductivity type impurity layers serving as the first and the second horizontal channels. Thereby, the pinning potential of the transfer channel is set deeper than the pinning potential of the horizontal channels, and the gate voltage leading to the pinning of the transfer channel is set smaller in its absolute value than the gate voltage leading to the pinning of the horizontal channels.

According to a third aspect of the present invention, in a charge coupled device, the impurity concentration of the second conductivity type impurity layer serving as the transfer channel is set higher than the impurity concentration of the second conductivity type impurity layers serving as the first and second horizontal channels, and the thickness of the insulating layer between the transfer channel and the gate electrodes is set thinner than the thickness of the insulating film between the first and second horizontal channels and the gate electrodes. Thereby, the pinning potential of the transfer channel is set deeper than the pinning potential of the horizontal channels, and the gate voltage leading to the pinning of the transfer channel is set smaller in its absolute value than the gate voltage leading to the pinning of the horizontal channels.

According to a fourth aspect of the present invention, in a charge coupled device, the impurity concentration of the first conductivity type semiconductor substrate below the transfer channel part is set lower than the impurity concentration of the first conductivity type semiconductor substrate below the first and second horizontal channel parts, and the thickness of the insulating film between the transfer channel and the gate electrodes is set thinner than the thickness of the insulating film between the first and second horizontal channels and the gate electrodes. Thereby, the pinning potential of the transfer channel is set deeper than the pinning potential of the horizontal channels, and the gate voltage leading to the pinning of the transfer channel is set smaller in its absolute value than the gate voltage leading to the pinning of the horizontal channels.

According to a fifth aspect of the present invention, a production method of a charge coupled device comprises process steps of producing a second conductivity type region on a first conductivity type substrate, producing a second conductivity type region having less concentration than that of the above-described second conductivity type region by annealing, producing first and second horizontal channels by implanting second conductivity type impurities only into regions to be first and second horizontal channels in the second conductivity type region of less concentration, and implanting first type impurities at such implantation energy and dose quantity that changes the second conductivity type region of less concentration at below the first and second horizontal channel regions to first conductivity type regions.

According to a sixth aspect of the present invention, a production method of a charge coupled device comprises process steps of producing a second conductivity type region of low concentration on a first conductivity type substrate, forming a first gate insulating film between the transfer channel and the gate electrodes in a thickness thinner than the thickness of a second gate insulating film provided between the horizontal channel and the gate electrodes, implanting second conductivity type impurities only into the second conductivity type region of less concentration below the first gate insulating film with using the second gate insulating film as a mask thereby to produce a transfer channel.

According to a seventh aspect of the present invention, a production method of a charge coupled device comprises process steps of producing a second conductivity type region on a first conductivity type substrate, producing a gate insulating film on the second conductivity type region, producing an insulating film comprising a material other than the gate insulating film on the gate insulating film on a region where a transfer channel is to be produced, implanting first conductivity type impurities using the resist pattern, which is used for patterning the insulating film comprising a material other than the gate insulating film, as a mask, thereby to produce first and second horizontal channels and a transfer channel therebetween, and forming the gate insulating film on a region of the transfer channel in a thickness thinner than the thickness of the gate insulating film on a region of the first and second horizontal channels.

According to an eighth aspect of the present invention, a production method of a charge coupled device comprises process steps of producing a junction desired for horizontal channels on a first conductivity type semiconductor substrate, producing a gate insulating film on the semiconductor substrate, patterning a photoresist on the gate insulating film so as to have an aperture at a region corresponding to the transfer channel region, removing a part of the gate insulating film on the transfer channel region by anisotropic etching, and implanting impurities using the photoresist, which is used for anisotropically etching the gate insulating film, as a mask, thereby to produce a desired junction at the transfer channel part.

In accordance with the present invention, the charges in the first horizontal channel can be transferred to the transfer channel by a gate voltage leading to the pinning of the horizontal channel being applied to the gate electrode provided on the horizontal channel, and furthermore, the charges can be transferred from the transfer channel to the second horizontal channel by clock signals being applied to the gate electrode provided on the horizontal channel.

In addition, since the transfer channel and the horizontal channels having the above-described potential relations are self-alignedly produced on the substrate, no potential hollow or potential barrier is produced between the transfer channel and the horizontal channels, thereby resulting in a charge coupled device having a good charge transfer characteristics.

DETAILED DESCRIPTION OF THE PREFERRED EMBODIMENTS

Embodiments of the present invention will be described in detail with reference to the drawings.

Before describing the embodiments of charge coupled devices of the present invention, surface channel pinning phenomenon in such charge coupled devices will be described in detail.

Figure 5:
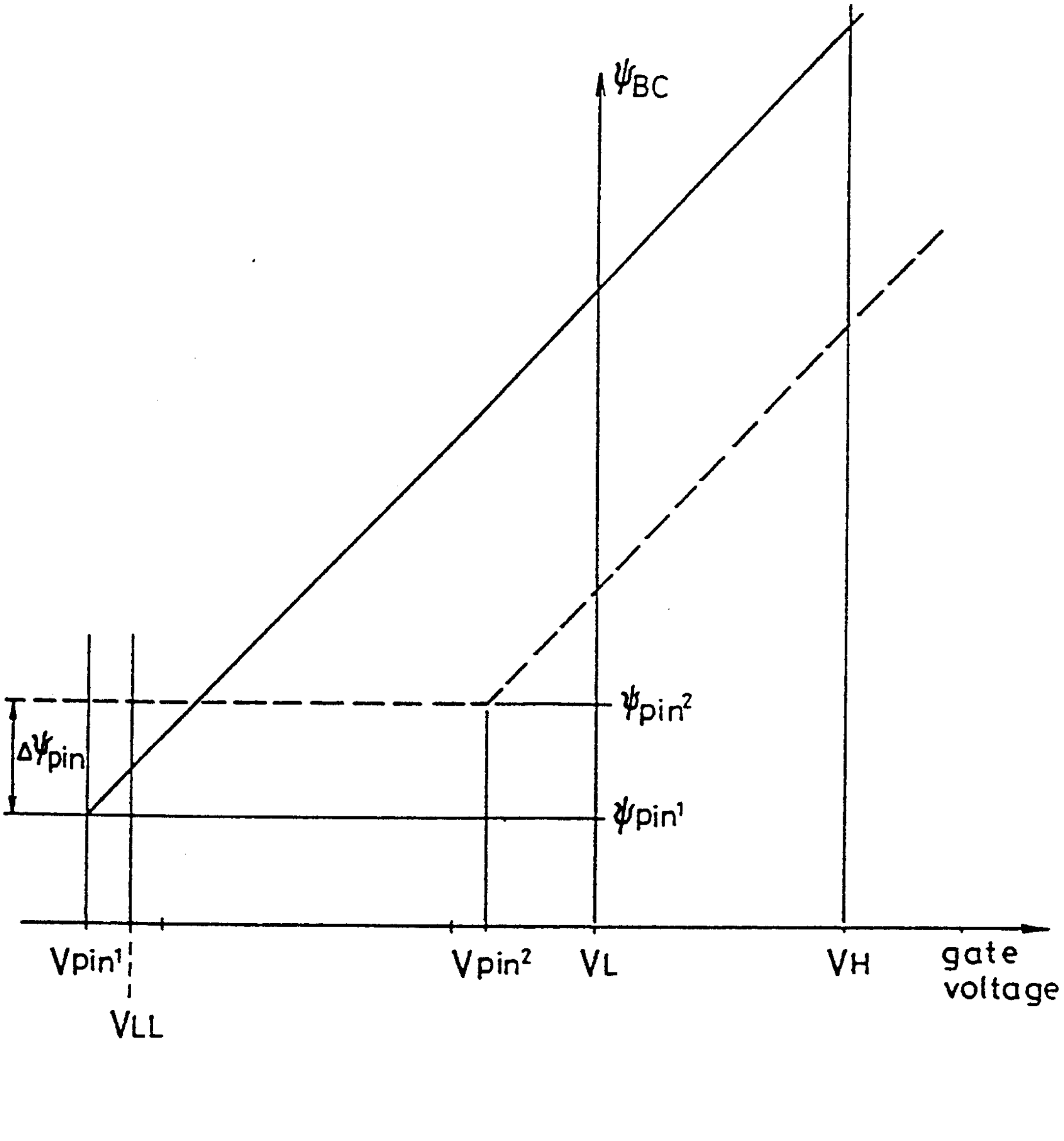
FIG. 5 is a diagram showing the relation between the voltage applied to the gate electrode and the minimum value of potential in a buried channel CCD (BCCD)
Figure 6A:
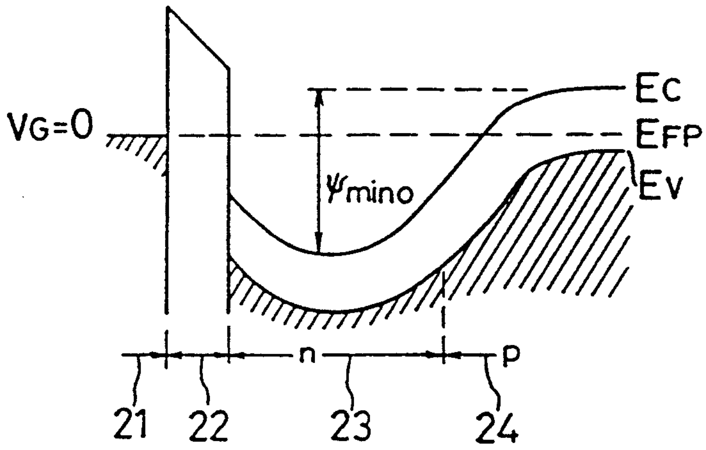
FIGS. 6(*a*) and 6(*b*) are diagrams showing the relation between the gate voltage and the energy band in the depth direction in BCCD.
Figure 6B:
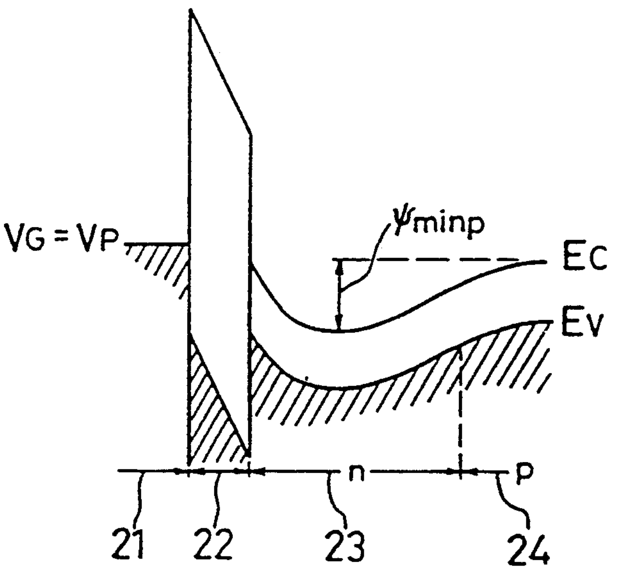

FIGS. 6(*a*) and 6(*b*) show the relation between the voltage $V_G$ applied to the gate electrode and the energy band in the depth direction of a buried channel CCD (hereinafter referred to as BCCD). FIG. 5 shows the relation between the gate voltage and the minimum potential shown in the energy band of FIG. 6.

The BCCD is a device in which a potential distribution produced in a depleted buried channel layer is varied by a clock signal pulse applied to the gate electrode and thereby transferring majority carriers. The above-described surface channel pinning is a characteristic phenomenon of the BCCD.

FIG. 6(*a*) shows the energy band in a depth direction of the BCCD in a case where the voltage $V_G$ applied to the gate electrode 31 is "0". In FIG. 6(*a*), $E_C$ represents the conduction band edge and $E_V$ represents the valence band edge. $E_{FP}$ represents the Fermi level of a p type Si substrate, and this corresponds to 0 V because the substrate is grounded. In addition, the hatched part shows a region where electrons exist, and reference numerals 22, 23 and 24 designate an oxide film, a buried channel and a semiconductor substrate, respectively.

Here, the buried channel layer 23 of the BCCD is completely depleted, and the energy band is curved downward by the donor type fixed charges in the channel layer 23, resulting in a minimum potential value $\Psi_{mino}$. This minimum value depends on the gate voltage $V_G$, and the dependency is shown by the straight line of FIG. 5. In this case, when the gate voltage $V_G$ is increased, the minimum value $\Psi_{BC}$ also increases. When a negative voltage applied as the gate voltage $V_G$ is increased in its absolute value, the potential minimum value $\Psi_{BC}$ (which corresponds to $\Psi_{min}$ in FIG. 6(*a*) decreases with the decrease of the gate voltage, and below some gate voltage $V_P(V_{pin}1, V_{pin}2)$, the decrease in the minimum value stops at $\Psi_{minp}(\Psi_{pin}1, \Psi_{pin}2)$. This is because when the gate voltage $V_G$ is moved to the negative, the position of the valence band of the buried channel 23 at the interface between the oxide film 22 and the buried channel 23 becomes equal to that in the p type Si substrate 24 at as shown in FIG. 6(*b*). Accordingly, even if a further negative gate voltage is applied so as to raise the energy band upward, holes are supplied from the channel stopper layer at the same potential as the p type substrate 24 at the periphery of the BCCD to the interface between the buried channel layer 23 and the oxide film 22, and the slope of the energy band is fixed. This is a phenomenon called surface channel pinning.

Next, the relation between the impurity profile of the buried channel part of the CCD and the potential as a function of the gate bias voltage shown in FIG. 5 will be briefly described. Generally, as the depth of the buried junction of the CCD becomes deeper or the concentration of the buried channel becomes higher, the the potential of CCD becomes deeper. Furthermore, as the surface concentration of the buried channel CCD increases, the gate voltage $V_{pin}$ at which the potential pinning occurs in FIG. 5 has a larger absolute i.e., negative value.

Accordingly, in order to obtain the potential change represented by the solid line of FIG. 5, a buried channel having a shallow junction and a high surface concentration is required, and in order to obtain a potential change represented by the dotted line of FIG. 5, a buried channel having a deep junction and a low surface concentration is required. For example, when the buried channel is produced by implanting phosphorus ions in a dosage of approximately $1.5$ to $2.0\times10^{12}$ $cm^{-2}$ into a p type substrate having a concentration of approximately $1\times10^{16}$ $cm^{-3}$ and annealing the substrate at 1000° to 1050° C. for 15 to 60 minutes, its junction depth becomes approximately 0.3 to 0.4 micron and its surface concentration is approximately $7\times10^{16}$ to $1.2\times10^{17}$ $cm^{-3}$. Then a pinning potential of 7 to 9 V at a gate voltage $V_G=0$ V, a pinning start voltage of $-8$ to $-10$ V and a pinning potential of 1.5 to 2.5 V are obtained. When the buried channel is produced by implanting phosphorus ions by a dosage of approximately 1.0 to $1.5\times10^{12}$ $cm^{-2}$ into the same substrate as above and annealing the substrate at 1100° to 1200° C. for about 15 to 60 minutes, its junction depth becomes approximately 0.7 to 1.2 microns and its surface concentration is approximately 1 to $5\times10^{16}$ $cm^{-3}$. Then, a potential of 4 to 6 V at the gate voltage $V_G=0$ V, a pinning start voltage of $-2$ to $-5$ V and a pinning potential of 3 to 5 V are obtained. That is, a buried channel CCD which produces such potential changes as shown by the solid line and the dotted line of FIG. 5 can be obtained.

A charge coupled device in accordance with a first embodiment of the present invention will be described in detail.

In this first embodiment, a connection between serial transfer CCDs is applied to a solid state imaging device of an inter-line transfer system.

Figure 1:
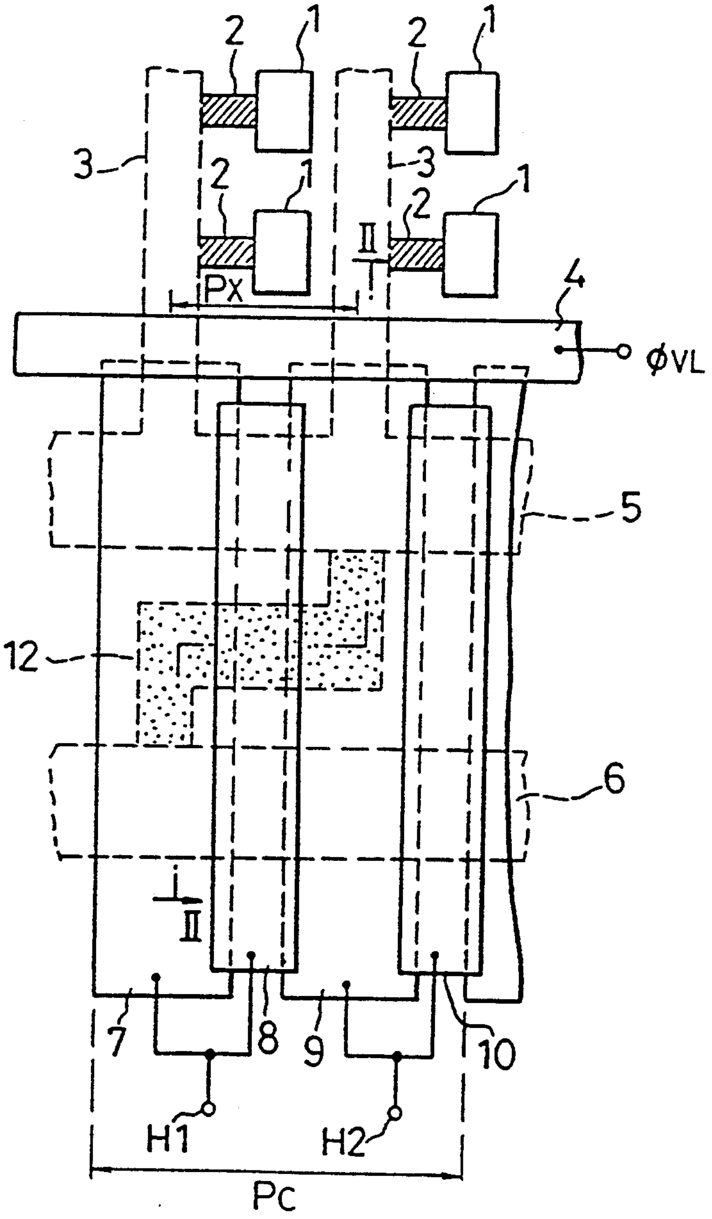
FIG. 1 is a plan view showing a charge coupled device in accordance with the present invention.
Figure 2:
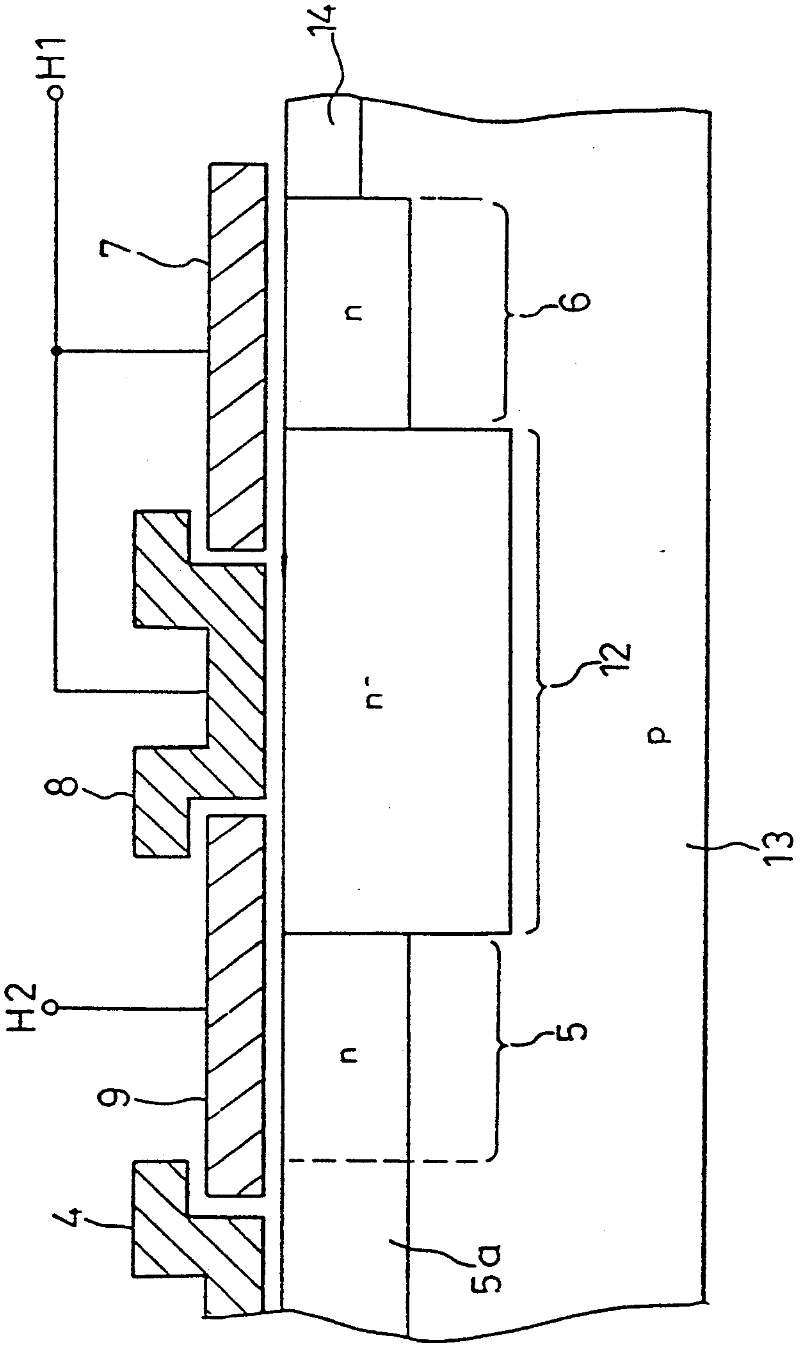
FIG. 2 is a cross-sectional view taken along a line II—II of FIG. 1 in accordance with a first embodiment of the present invention.

FIG. 1 is a plan view showing a brief construction of an CCD in accordance with the first embodiment, and FIG. 2 is a cross-sectional view taken along a line II—II of FIG. 1.

In these figures, reference numeral 1 designates photodiodes arranged in a two-dimensional array. A transfer gate 2 for transferring charges from the photodiode 1 to the vertical CCD channel 3 is provided between each photodiode 1 and the corresponding vertical CCD channel 3. A final electrode 4 of the vertical CCD channel 3 is perpendicular to the vertical CCD channel 3 and connected to the terminal $\phi$VL. Reference numerals 5 and 6 designate first and second horizontal CCD channels, respectively, reference numeral 5*a* designates an n type buried layer producing the respective horizontal CCD channels 5 and 6, and reference numerals 7 to 10 designate transfer electrodes for transfer of charges by the horizontal CCD channels. Reference numeral 12 designates a transfer channel connecting the first horizontal CCD channel 5 with the second horizontal CCD channel 6. This transfer channel 12 has a deeper junction and lower impurity concentration than the buried channel layers 5 and 6. The potentials of the buried channel layers 5 and 6 and the potential of the buried channel layer 12 respectively correspond to the solid line and the dotted line of FIG. 5. In addition, in FIG. 2, reference numeral 14 designates a channel stopper region.

Figure 3:
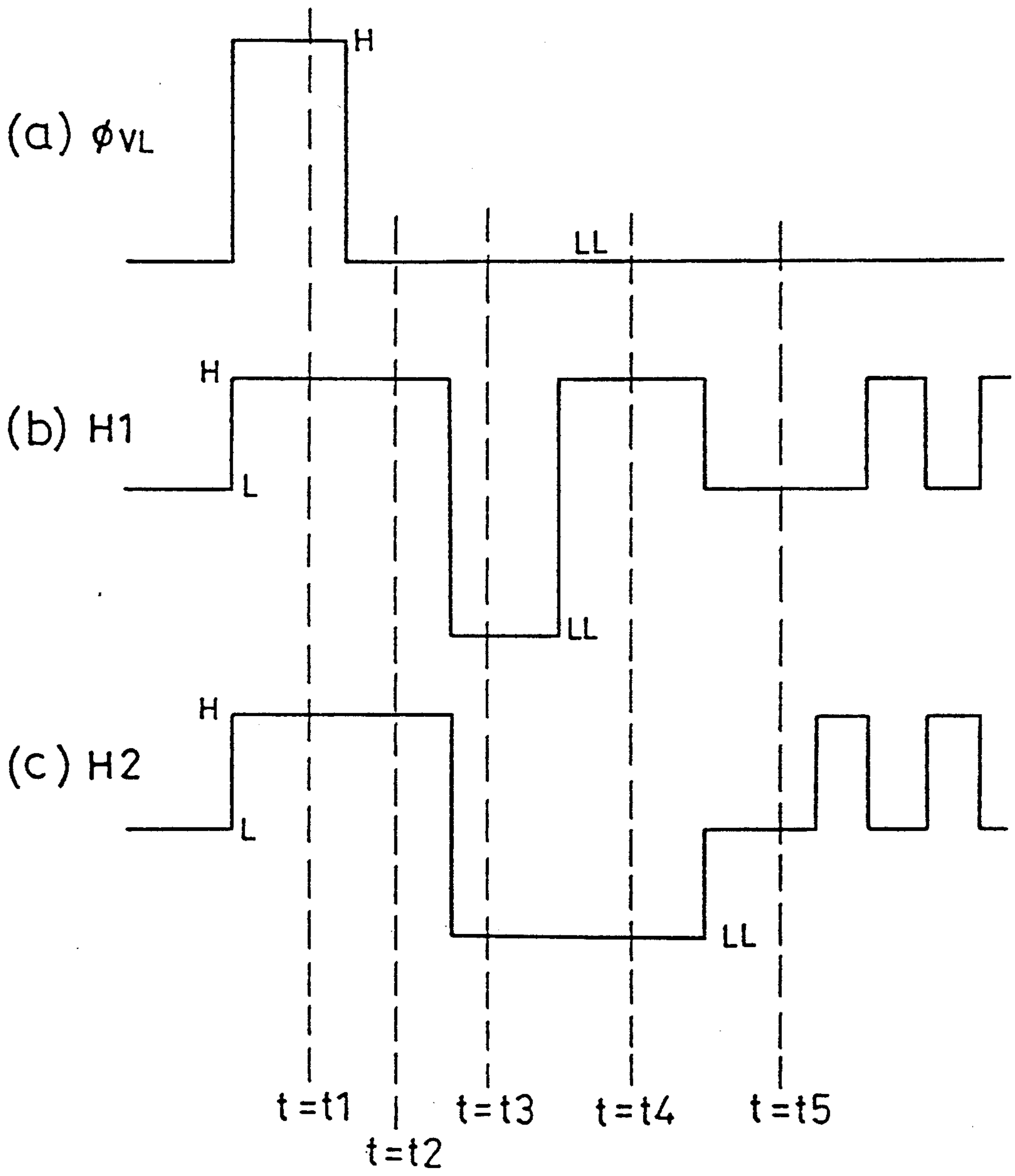
FIGS. 3(*a*)-3(*c*) are time charts showing clock pulses applied to the respective terminals of the charge coupled device of FIG. 1.

FIGS. 3(*a*)–3(*b*) show time charts of clock pulses applied to the respective terminals of the construction of FIG. 1 during charge transfer. Here, pulses shown in FIGS. 3(*a*) to 3(*c*) are applied to the respective terminals VL, H1 and H2.

Figure 4:
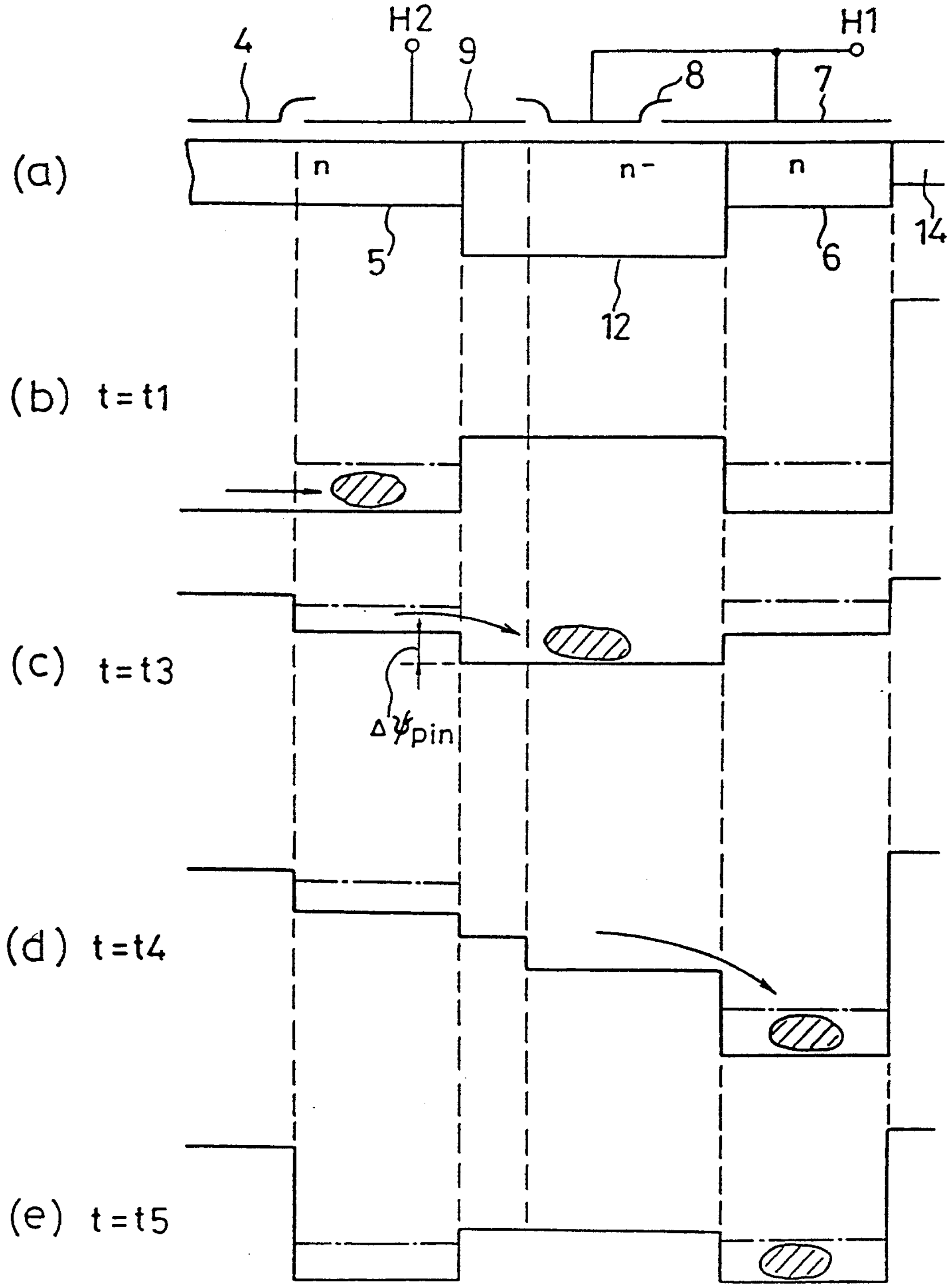
FIG. 4(*a*) is a cross-section of the channels, electrodes, and terminals of the CCD and FIGS. 4(*b*)-4(*e*) are diagrams schematically illustrating the change of potential and the transition of signal charges at various times in a cross-section taken along a line II—II of FIG. 1 in accordance with the first embodiment of the present invention.

FIGS. 4(*a*)–4(*e*) are diagrams schematically illustrating the potential change and the transition of signal charges at each time in the cross-section taken along a line II—II of FIG. 1 Here, FIG. 4(*a*) shows respective channels, electrodes and terminals of the CCD and FIGS. 4(*b*), 4(*c*), 4(*d*) and 4(*e*) show charged states at time $t_1$, $t_3$, $t_4$ and $t_5$, respectively.

Next, the charge transfer operation of the solid-state imaging device of the construction of FIG. 1 will be described with reference to FIGS. 3 to 5.

While in the conventional device the two clock pulses "H" and "L" are applied to the electrodes, three clock pulses of "H", "L" and "LL" are applied in this embodiment.

Figure 11:
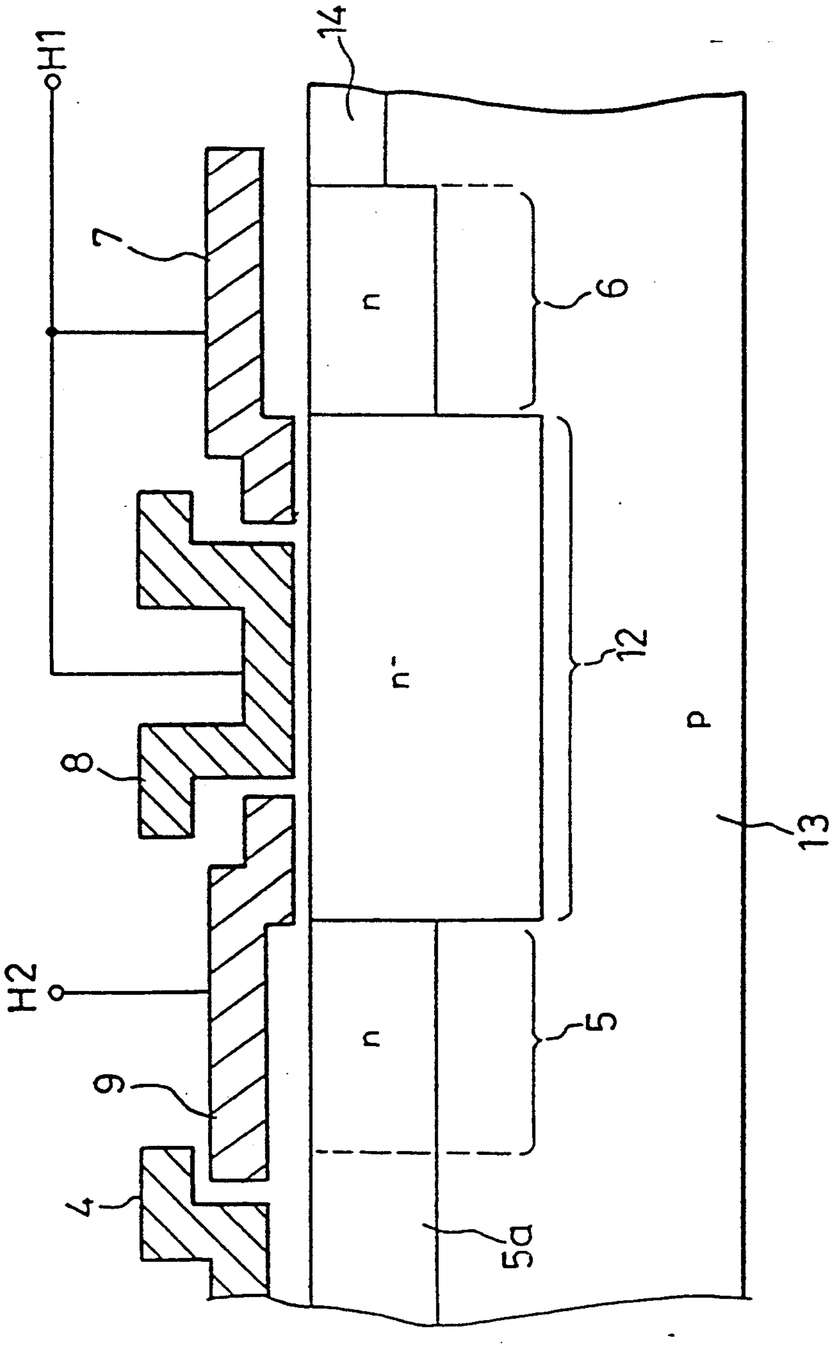
FIG. 11 is a cross-sectional view showing an alternative of the charge coupled device of FIG. 2.

First, as shown in FIGS. 3(*a*) to 3(*c*), the clock pulses applied to the terminals $\phi$VL, H1 and H2 at time $t_1$ all become "H" level and charges are transferred from the vertical CCD channel 3 to the potential well below the electrodes 7 and 9 of the horizontal CCD channel 5. At time $t_2$, the terminal $\phi_{VL}$ becomes the lowest level "LL", and the transfer of charges from the vertical CCD channel 3 to the horizontal channel 5 is completed. Subsequently, at time $t_3$, the clock pulses applied to the terminals $H_1$ and $H_2$ become the lowest level "LL" as shown in FIG. 3(*b*) and 3(*c*). As previously described, the potential minimum in the BCCD does not become shallower once the pinning potential is exceeded. However, since the pinning potential at the n− type semiconductor layer produced in the transfer channel 12 is deeper than the pinning potential of the horizontal channel 5, a potential difference $\Delta\Psi_{pin}$ shown in FIGS. 4 and 5 exists. Because of this potential difference $\Delta\Psi_{pin}$, the signal charges below the electrode 9 of the horizontal CCD channel 5 are transferred to below the transfer channel 12. At time $t_4$, the clock pulse applied to the terminal $H_1$ becomes "H", and the signal charges below the transfer channel 12 are transferred to the potential well below the electrode 7 of the horizontal CCD channel 6. Then, the charges transferred to the potential well below the electrode 7 of the horizontal CCD channel 5 remain there because the terminal $H_1$ and the terminal $H_2$ do not become "L" level and "H" level, respectively. At time $t_5$, the terminals $H_1$ and $H_2$ become "L" level and, thereafter, the same operation as that after time $t_6$ of FIG. 11 is performed.

The potential value of the transfer channel part 12 when the gate voltage is at "L" and "H" level of the terminals $H_1$ and $H_2$ is required to be shallow enough to prevent the transfer charges from flowing into the transfer channel region 12 when the horizontal CCD channels 5 and 6 transfer the charges. This will be described with reference to FIGS. 7 and 8.

Figure 7:
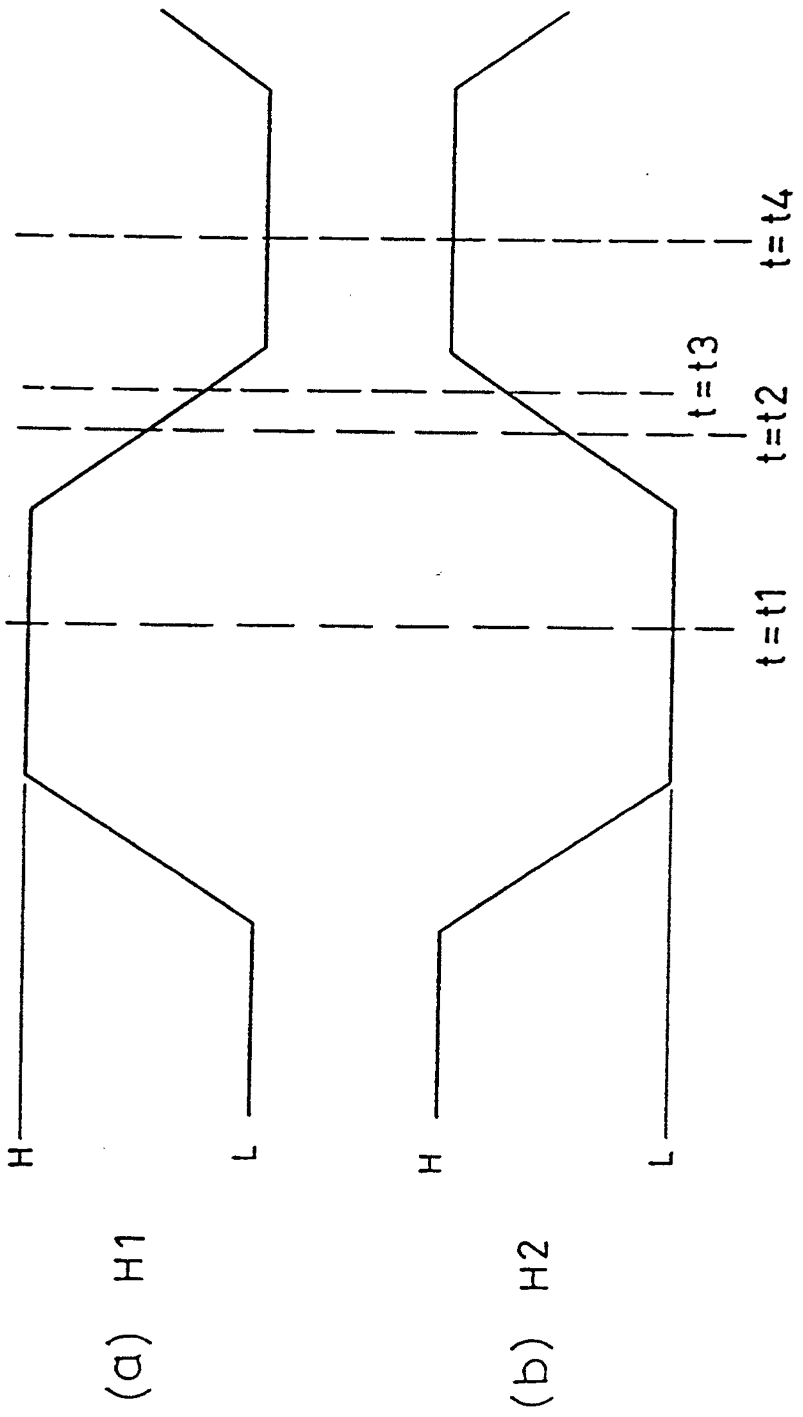
FIGS. 7(*a*) and 7(*b*) are time charts showing transfer clock pulses of the horizontal CCD channels.
Figure 8:
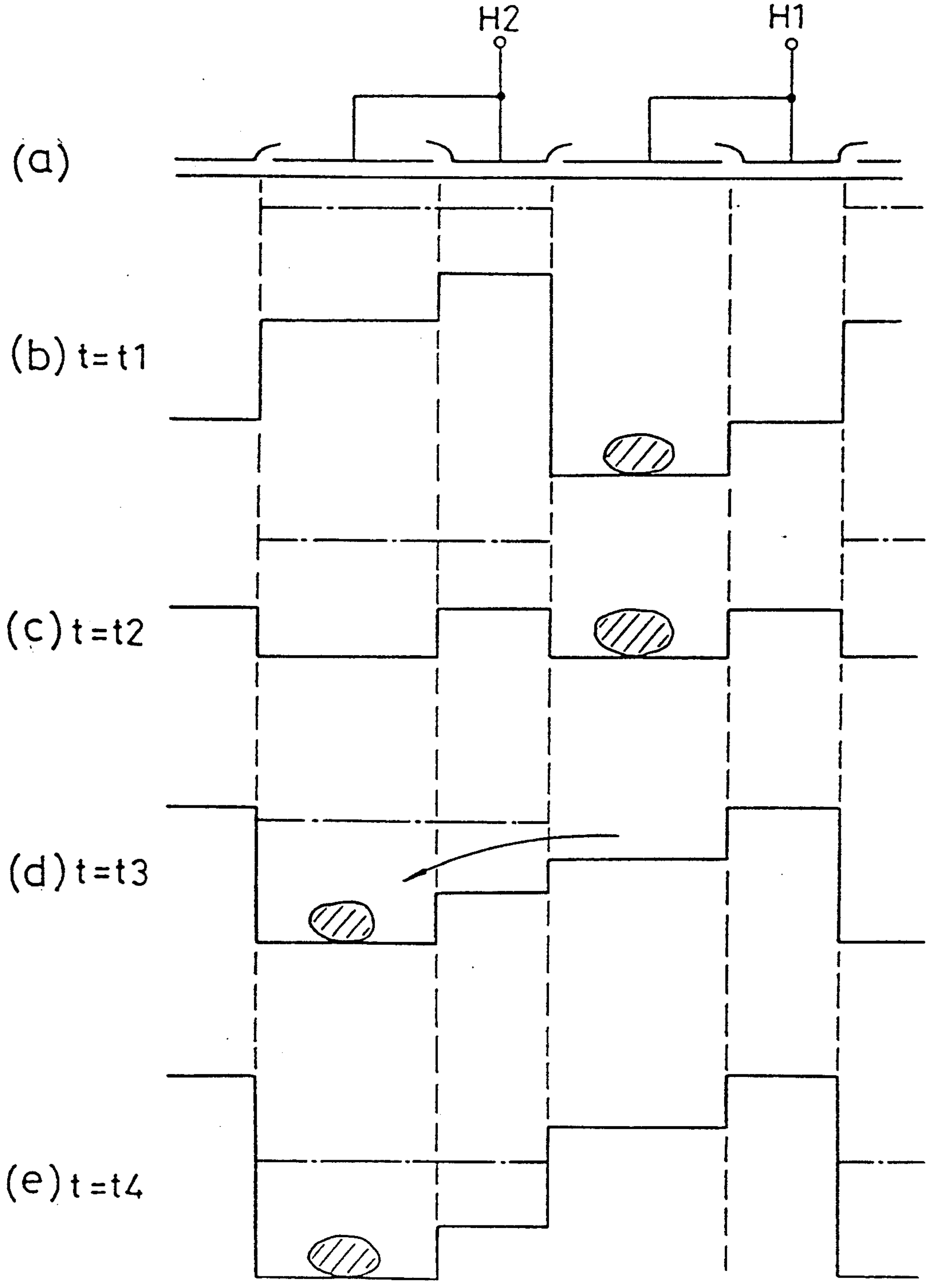
FIG. 8(*a*) is a diagram of the electrodes in horizontal CCD channels and FIGS. 8(*b*)-8(*e*) are diagrams showing the potential change, at charge transfer in the horizontal CCD channels at different times.
Figure 21:
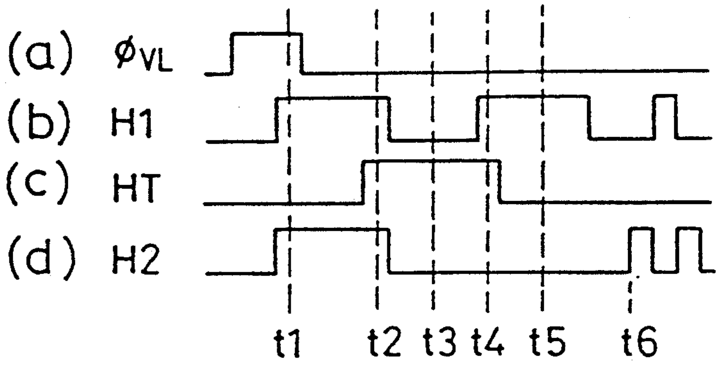
F I G. 21 (PRIOR ART)
FIGS. 21(*a*)-21(*d*) are time chart showing clock pulses applied to the respective terminals of the charge coupled device of FIGS. 20(*a*) and 20(*b*)
Figure 22:
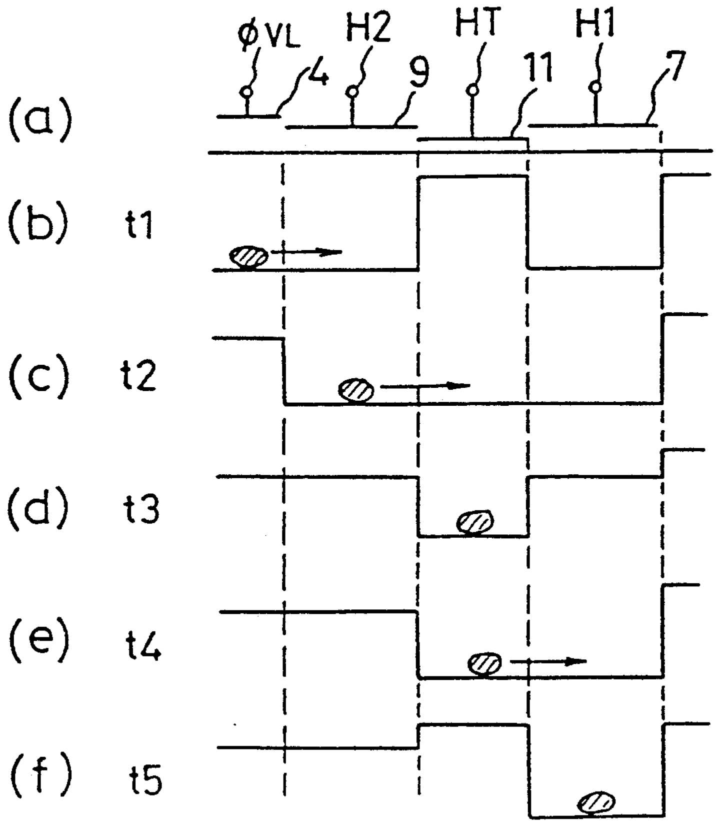
F I G. 22 (PRIOR ART)
FIGS. 22(*a*)-22(*f*) are diagrams diagram schematically showing the change of potential and the transition of signal charges at various times in a cross-section taken along a line XII—XII of FIG. 20.

FIGS. 7(*a*)-7(*b*) show clock signals during the charge transfer after time $t_6$ of FIG. 21 in the horizontal CCD channels. FIGS. 8(*a*)-8(*e*) show the potentials below the electrodes of the terminals $H_1$ and $H_2$ in the horizontal CCD channel at each time of FIGS. 7(*a*) and 7(*b*). Furthermore, the dashed line of FIGS. 8(*a*)-8(*e*) shows the potential of the transfer channel region 12 of FIG. 1, wherein FIGS. 8(*a*) shows terminals $H_1$ and $H_2$ and FIG. 8(*b*) to 8(*e*) show potentials at times $t_1$ to $t_4$, respectively.

First, it is supposed that charges exist below the terminal $H_1$ at time $t=t_1$ of FIG. 7. At time $t_2$, the potentials of the horizontal CCD channels below the terminals $H_1$ and $H_2$ become equal to each other. Then, at time $t_3$, the potential of the barrier part of the horizontal CCD channel below the terminal $H_2$ becomes deeper than the potential of the storage part below the terminal $H_1$, and the charges are transferred from below the terminal $H_1$ to below the terminal $H_2$, and at time $t_4$, the transfer is completed. Here, if the potential of the transfer channel part 12 is shallower by about 1 to 2 V than the potential of the barrier part below the terminal $H_2$ at time $t_3$, the charges hardly flow into the transfer channel region 12 while they are transferred from below the terminal $H_1$ to below the terminal $H_2$.

Figure 9A:
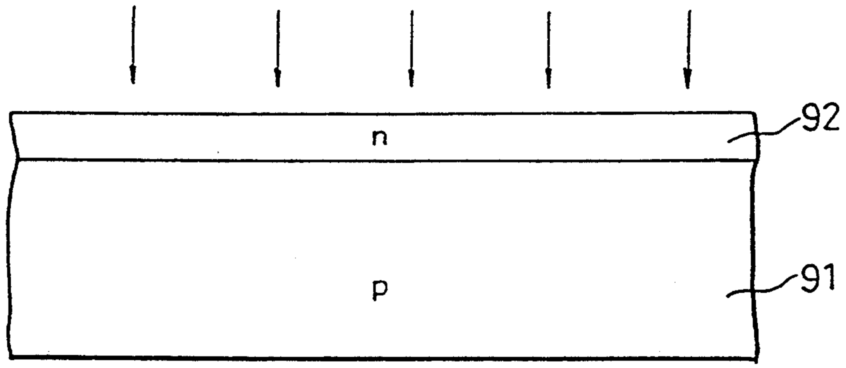
FIGS. 9(*a*) to 9(*c*) are cross-sectional views showing a production method of the charge coupled device of FIG. 2.
Figure 9B:
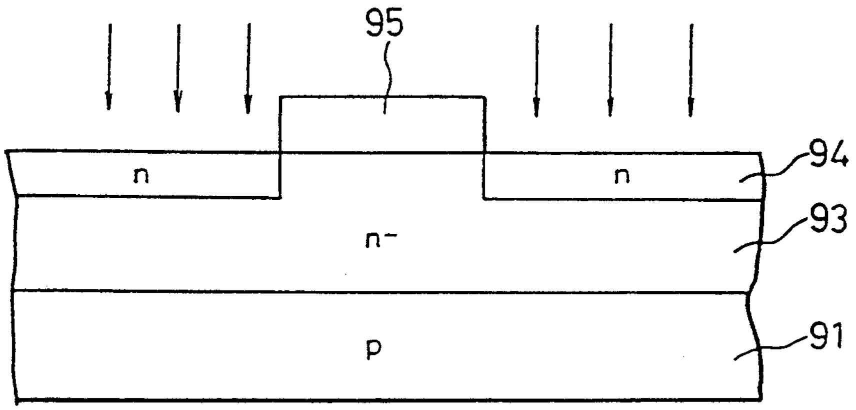
Figure 9C:
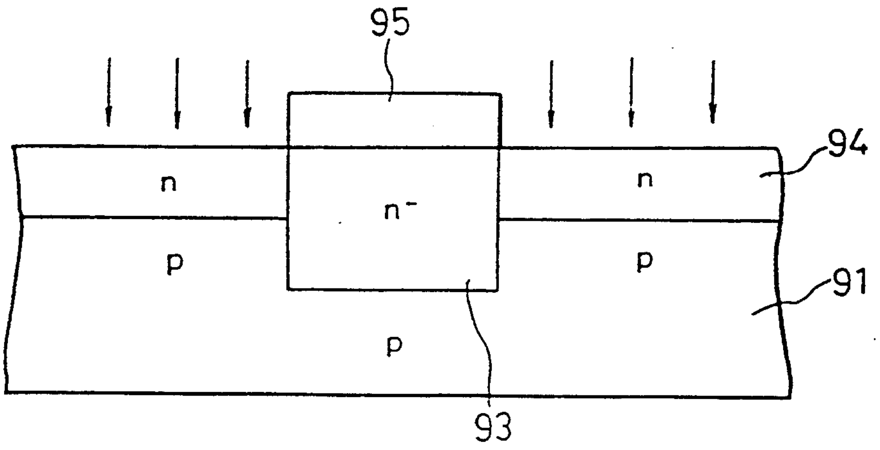

Description is now given of the production method of the charge coupled device according to the first embodiment of the present invention with reference to FIGS. 9(*a*)-9(*c*).

First of all, second conductivity type (n type) impurities are implanted into a region corresponding to a transfer channel and first and second horizontal channels on a first conductivity type (p type) semiconductor substrate 91 in a dosage of approximately 1.0 to 1.5 $\times 10^{12}$ $cm^{-2}$, thereby to produce an n type layer 92 as shown in FIG. 9(*a*). Then, an appropriate annealing is applied to the n− type layer 92 to broaden the n type layer 92, resulting in an n− type layer 93 having less concentration. Thus, a desired pn junction of the transfer channel 12 as shown in FIG. 2 is produced between the n− type layer 93 and the p type substrate 91.

Next, in order to produce a junction such as shown in FIG. 2 at regions to become first and second horizontal CCD channels 5 and 6, a region to become a transfer channel is masked by a mask material 95, second conductivity type (n type) impurities are implanted in a dosage of approximately 3.0 to $6.0\times10^{12}$ $cm^{-2}$ so as to obtain a potential desired for the regions to become the first and the second horizontal channels 5 and 6, thereby to produce an n type layer 94 (FIG. 9(*b*)). In this stage, the junction between the first and the second horizontal CCD channel regions is produced between the n− layer 93 and the substrate 91.

In order to make the pinning potential of the first and the second horizontal CCD shallow, the junctions of these regions are required to be shallower. That is, first conductivity type (p type) impurities of sufficiently high energy and large dosage which enables making the junction which has been produced at a deep position shallower, are implanted using the mask 95 as shown in FIG. 9(*c*), thereby to make the junction of the first and the second horizontal channel regions shallow. In a case where boron ions are used as p type impurities, the construction shown in FIG. 2 can be obtained when boron ions are implanted at an implantation energy of 200 to 1000 keV and a dosage of approximately $1\times10^{11}$ $cm^{-2}$ to $1\times10^{13}$ $cm^{-2}$.

Figure 10A:
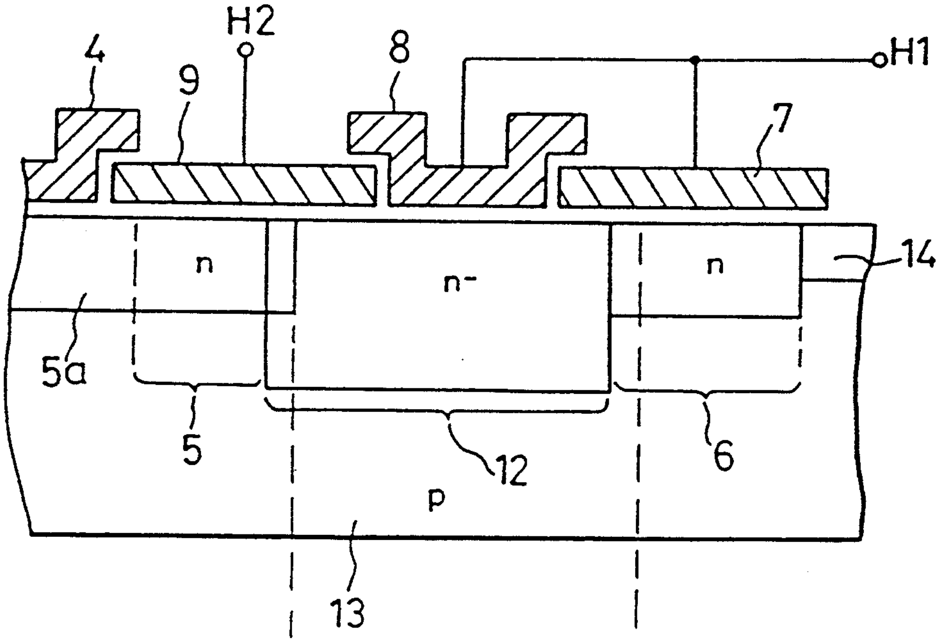
FIG. 10(*a*) is a cross-sectional view of a CCD and FIG. 10(*b*) is a potential diagram illustrating problems which may possibly arise in the convent production method.
Figure 10B:
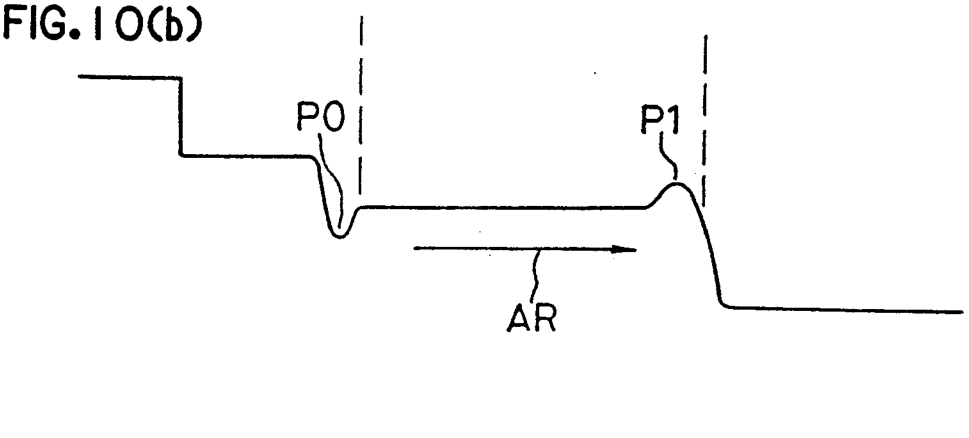

In such a production method, since the n− type layer serving as transfer channel and the n type layers serving as horizontal channels can be produced self-alignedly and there is no deviation in the junction portion, no potential hollow or potential barrier arises. If deviation arises in the junction part as shown in FIG. 10(*a*), a potential well PO or a potential barrier Pl arises as shown in FIG. 10(*b*). This FIG. 10(*b*) corresponds to time $t=t_4$ of FIG. 4, and AR represents charge transfer direction.

Generally, when the impurity profile of the channel part is uniform and only the thickness of the gate insulating film on the channel region differs from each other, its pinning potential does not change but the pinning start voltage changes. Then the pinning start voltage becomes smaller in its absolute value i.e., in negative value, as the gate insulating film becomes thinner. Furthermore, whether the gradient of the potential change at the gate voltage is higher than the pinning start voltage does not depend on the thickness of the gate insulating film. Therefore, when a gate voltage higher than the pinning start voltage is applied, the pinning potential become higher as the gate insulating film become thicker. When the potential of the barrier part of the horizontal channel and the potential of the transfer channel are close to each other, charges may possibly be injected into the transfer channel from the barrier part during charge transfer at the respective horizontal channels after the sharing operation is completed.

Accordingly, as shown in FIG. 11, the insulating film between the transfer channel and the gate electrodes is thinner than the insulating film between the first and the second horizontal channels and the gate electrodes in the impurity profile structure shown in FIG. 2, whereby the charge transferring operation can be more easily performed.

A charge coupled device in accordance with a second embodiment of the present invention will be described.

Figure 12:
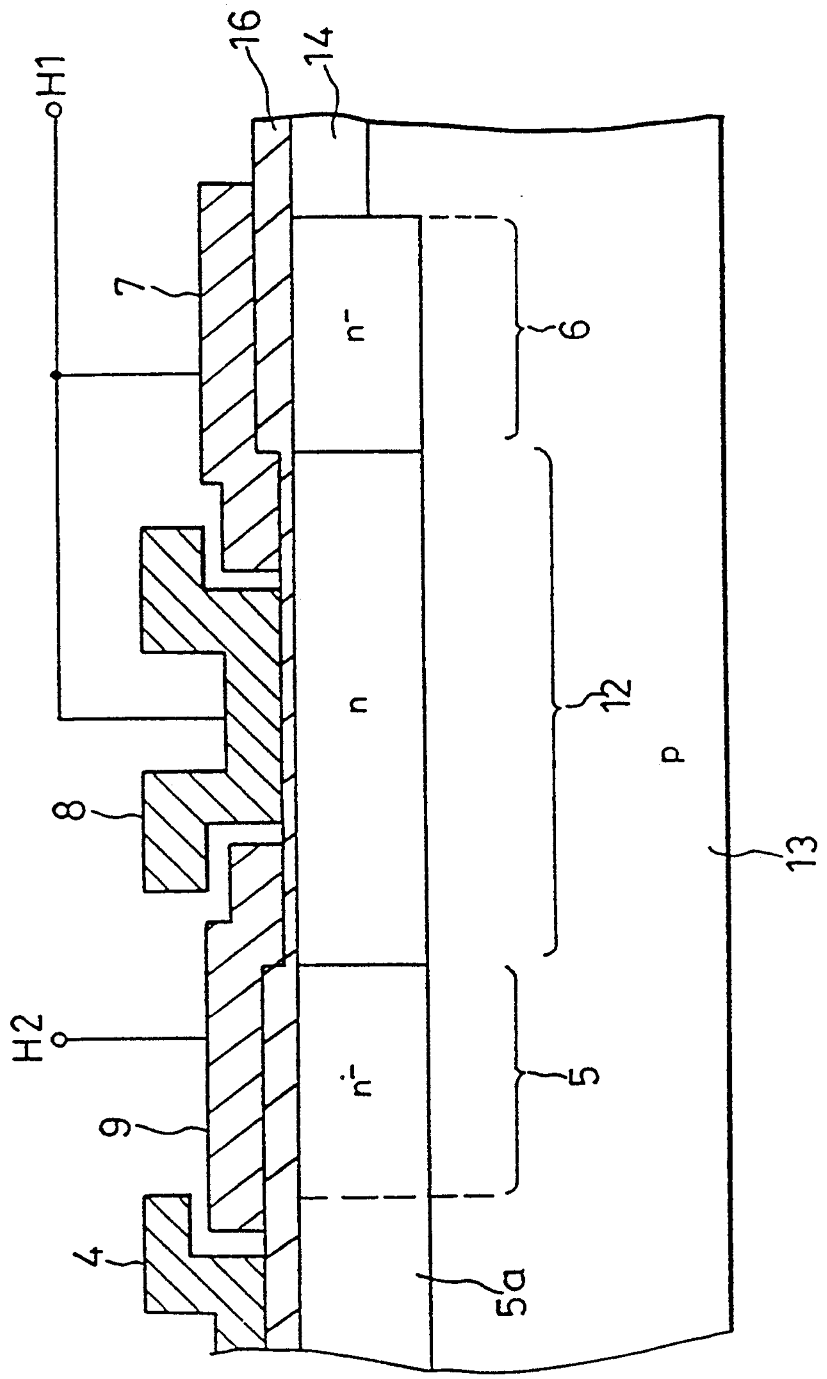
FIG. 12 is a cross-sectional view taken along a line II—II of FIG. 1 in accordance with a second embodiment of the present invention.

The charge coupled device according to the second embodiment also has a plan pattern of FIG. 1, and its cross-sectional view taken along a line II—II of FIG. 1 is shown in FIG. 12. In this second embodiment, the impurity concentration profile and the junction depth of the first and second horizontal channel regions 5 and 6 and the transfer channel 12, and the thickness of the gate insulating film produced on the respective regions, are different from those of the first embodiment. In FIG. 12, reference numeral 14 designates a channel stop region and reference numeral 16 designates a gate insulating film.

Figure 13:
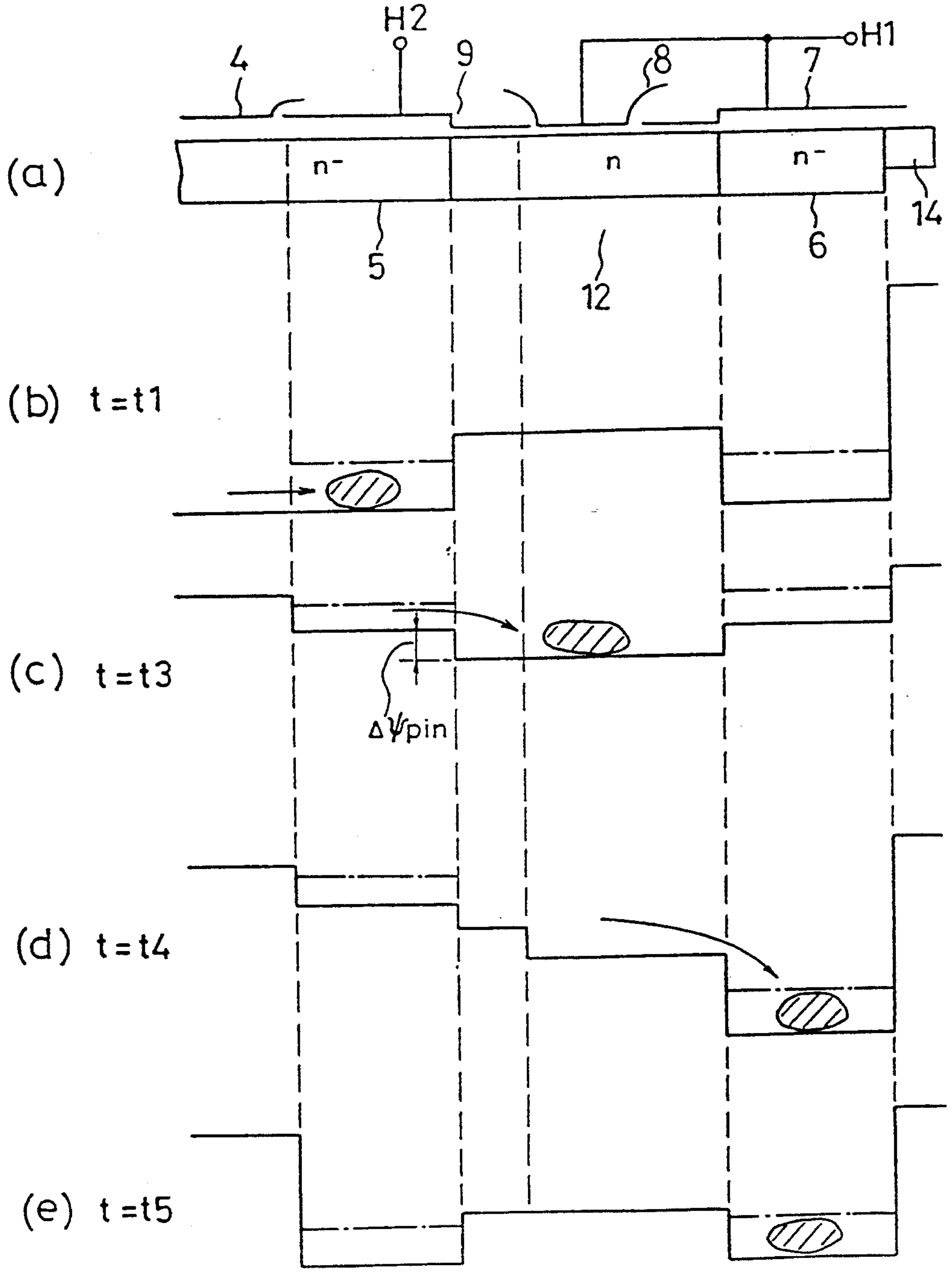
FIGS. 13(*a*)—13(*e*) are diagrams schematically showing the change of potential and the transition of signal charges at various times in a cross-section taken along a line II—II of FIG. 1 in accordance with the second embodiment of the present invention.

As shown in FIG. 13(*a*), the transfer channel region 12 has a dopant concentration higher than that of the buried channel layers 5 and 6, and the insulating film formed on the transfer channel layer 12 is thinner than the insulating film formed on the buried channel layers 5 and 6. Accordingly, the potentials of the buried channel layers 5 and 6 and the potential of the transfer channel layer 12 respectively correspond to the solid line and the dotted line of FIG. 5.

FIGS. 3(*a*)—3(*c*) show time charts of clock pulses applied to the respective terminals of the construction of FIG. 1 for charge transfer. Here, pulses shown in FIGS. 3(*a*) to 3(*c*) are applied to the respective terminals $\phi$VL, H1 and H2.

FIGS. 13(*a*)-13(*e*) are diagrams schematically showing the potential change and the transition of signal charge at times $t_1$ to $t_4$ in the cross-section taken along a line II—II of FIG. 1. Here, FIG. 13(*a*) shows respective channels, electrodes and terminals of the CCD and FIGS. 13(*b*), 13(*c*), 13(*d*) and 13(*e*) show charge states at time $t_1$, $t_3$, $t_4$ and $t_5$, respectively.

In this second embodiment, as shown in FIG. 12, since the impurity distribution of the transfer channel region 12 is thicker than that of the horizontal CCD channels 5 and 6, the pinning potential of the transfer channel region 12 becomes more negative than that of the horizontal CCD channels 5 and 6. Furthermore, the thickness of the gate insulating film on the transfer channel region 12 is made thinner than that on the horizontal CCD channel regions 5 and 6. As previously described, when the impurity profile of two channel regions are equal and only the thicknesses of the gate insulating films on the channel regions differ from each other, the pinning potential does not change but the pinning start voltages change. The thinner the gate insulating film is, the smaller the pinning start voltage in its absolute value, i.e., less negative, is. Furthermore, the gradient of the potential change at gate voltages higher than the pinning start voltage does not depend on the thickness of the gate insulating film, and therefore, when a gate voltage higher than the pinning start voltage is applied, the pinning potential increases as the gate insulating film becomes thicker.

Accordingly, in this second embodiment, the potential of the transfer channel region 12 is established such that its pinning potential is more negative than that of the horizontal CCD channel region 5 and 6, and the gate voltage leading to the pinning of the transfer channel region 12 is smaller in its absolute value, i.e., less negative than the gate voltage leading to the pinning of the horizontal channels 5 and 6, resulting in the same effects as in the above-described first embodiment.

Next, the charge transfer operation in the solid-state imaging element of the constructions of FIGS. 1 and 12 will be described.

Also in this embodiment, three clock pulses of "H", "L" and "LL" are applied to the respective terminals similarly as in the first embodiment.

First, as shown in FIGS. 3(*a*), 3(*b*) and 3(*c*), clock pulses applied to the respective terminals $\phi$VL, H1 and H2 are all "H" level at time $t_1$ and charges are transferred from the vertical CCD channel 3 to the potential wells below the electrodes 7 and 9 of the horizontal CCD channel 5. At time $t_2$, the terminal $\phi$VL becomes the lowest level "LL" and the charge transfer from the vertical CCD channel 3 to the horizontal channel 5 is completed. Then, at time $t_3$, clock pulses applied to the terminals H1 and H2 become the lowest level "LL" as shown in FIGS. 3(*b*) and 3(*c*). As previously described, the potential minimum in the BCCD hardly needs to exceed the pinning potential in order to become shallow. However, since the pinning potential at the n type semiconductor layer produced in the transfer channel 12 is deeper than the pinning potential of the horizontal channel 5, the potential difference $\Delta\Psi_{pin}$ shown in FIGS. 4 and 5 arises. Then, by this potential difference $\Delta\Psi_{pin}$, the signal charges stored below the electrode 9 of the horizontal CCD channel 5 are transferred to below the transfer channel 12. At time $t_4$, the clock pulse applied to the terminal $H_1$ becomes "H", and the signal charges stored below the transfer channel 12 are transferred to the potential well below the electrode 7 of the horizontal CCD channel 6. Then, the charges transferred to the potential well below the electrode 7 of the horizontal CCD channel 5 remain there because the terminal $H_1$ and the terminal $H_2$ do not become "L" level and "H" level, respectively. At time $t_5$, the terminals $H_1$ and $H_2$ become "L" level and, thereafter, the same operations as that after time $t_6$ of FIGS. 21(*b*) and 21(*d*) are performed.

Here, the potential value of the transfer channel region 12 when the gate voltage is at "L" or "H" level of the terminals $H_1$ and $H_2$ is required to be established shallow enough to prevent the transferred charges from flowing into the transfer channel region 12 when the horizontal CCD channels 5 and 6 transfer the charges.

A production method of the charge coupled device shown in FIG. 12 will be described.

Figure 14A:
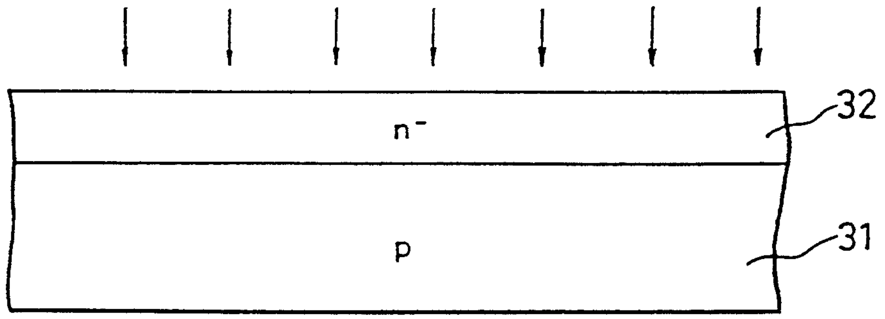
FIGS. 14(*a*) to 14(*c*) are cross-sectional views showing a production method of the charge coupled device of FIG. 12.
Figure 14B:
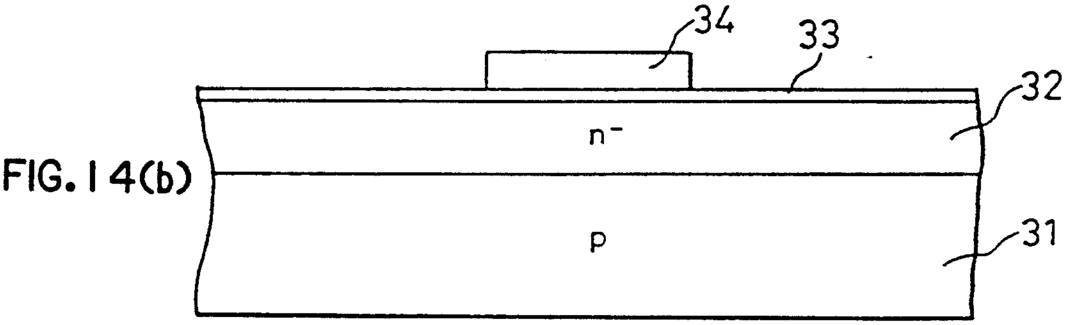
Figure 14C:
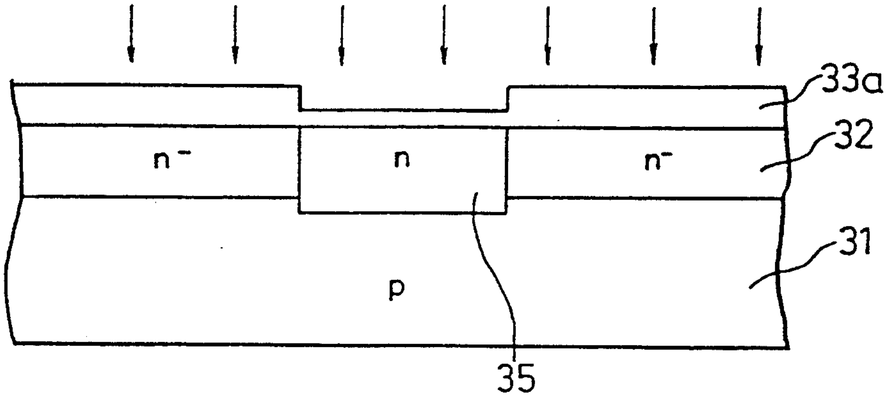

First of all, second conductivity type (n type) impurities are implanted into a region corresponding to a transfer channel and first and second horizontal channels on a first conductivity type (p type) semiconductor substrate 31 in a dosage of approximately $5\times10^{11}$ to $2\times10^{12}$ cm$^{-2}$, thereby to produce an $n^-$ type layer 32 as shown in FIG. 14(*a*). Then, an appropriate annealing is applied thereto and a desired junction for the horizontal channel regions 5 and 6 as shown in FIG. 1 is produced in the whole region.

Next, a gate oxide film 33 of a desired thickness for the transfer channel is deposited on the entire surface of the substrate and, thereafter, a process for thickening the oxide film on a region other than the transfer channel region is performed. That is, a nitride film 34 (for example, SiN film) is produced on a region to be a transfer channel as shown in FIG. 14(*b*), and a gate oxidation is performed with using this nitride film 34 as a mask. The nitride film 34 is removed after the oxidation, resulting in a configuration of the gate oxide film **33*a* as shown in FIG. 14**(*c*).

Next, with utilizing the difference in the thickness of the gate oxide film **33*a*, second conductivity type (n type) impurities are implanted at an implantation energy so that they are implanted only into the thin part of the gate oxide film 33*a*, in a dosage of approximately 1.0 to $5.0\times10^{12}$ cm$^{-2}$, whereby the impurity concentration of the transfer channel 35 is increased self-alignedly. Thereafter, the gate electrodes are produced without removing the gate oxide film 33*a***.

When the construction shown in FIG. 14(*c*) is produced, the potentials of the transfer channel and the horizontal channels can be established as desired. Generally, in the BCCD, as the impurity concentration is higher and the junction depth is deeper, the pinning potential is larger (refer to $\Psi_{pin}1$ and $\Psi_{pin}2$ of FIG. 5). Furthermore, the relation between the thickness of gate insulating film and the potential is as follows. The pinning potential hardly changes due to the difference in the thickness of the gate insulating film. On the other hand, as the gate oxide film becomes thinner, the pinning start voltage is smaller in its absolute value, i.e., less negative, while the ratio of the potential change to the change in a gate bias voltage higher than the pinning start voltage is constant. Accordingly, when the junction shown in FIG. 14(*c*) is produced, a potential relation between the transfer channel and the horizontal channels such as shown in FIG. 5 can be obtained.

This can be represented by a calculation on a completely depleted model utilizing a one-dimensional step junction. Here, it is supposed that the pinning arises when the voltage at the Si surface becomes −1 V (the substrate voltage of 0 V). Then, when the substrate concentration $N_A$ is approximately $1\times10^{15}$ $cm^{-3}$, a pinning start voltage $V_{pin}$ of approximately −2.4 V, a pinning potential of 4.6 V and a potential of 6.4 V at $V_G=0$ V are obtained in a transfer channel when the gate oxide film provided on the transfer channel is approximately 150 angstroms thick, the concentration of the buried channel $N_D$ is approximately $5.5\times10^{16}$ $cm^{-3}$, and the junction depth is 0.4 micron. On the other hand, a pinning start voltage $V_{pin}$ of approximately −9.5 V, a pinning potential of 2.4 V and a potential of 9.7 V at $V_G=0$ V are obtained in the horizontal channels when the gate oxide film provided on the horizontal channels is 1500 angstroms thick, the concentration of the buried channels is $N_D$ $3.5\times10^{16}$ $cm^{-3}$, and the junction depth is 0.3 micron. Thus, the potential relationship shown in FIG. 5 is obtained.

Although a desired junction is produced for a transfer channel after a desired junction is produced for the horizontal channels in the above-described production method, another production method can be employed when the junction structure of the present invention is produced.

Another production method of the charge coupled device according to the second embodiment of the present invention will be described with reference to FIGS. 15(*a*)–15(*c*).

Figure 15A:
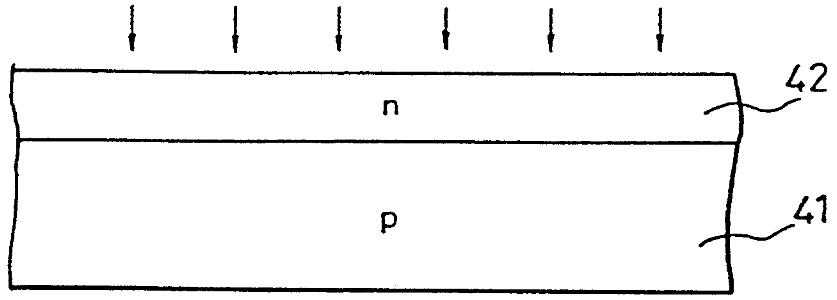
FIGS. 15(*a*) to 15(*c*) are cross-sectional views showing another production method of the charge coupled device of FIG. 12.
Figure 15B:
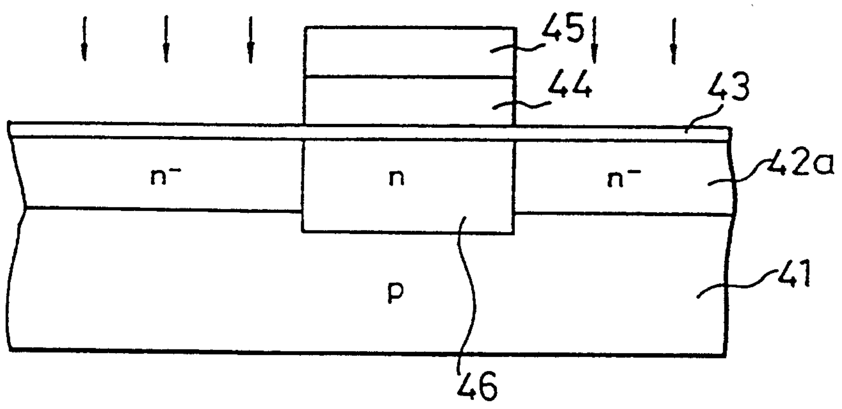
Figure 15C:
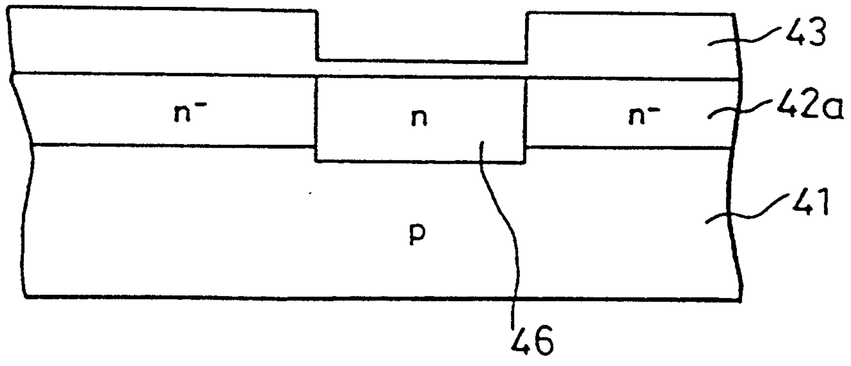

First of all, second conductivity type (n type) impurities are implanted into a p type substrate 41 in a dosage of approximately $1.0\sim5.0\times10^{12}$ $cm^{-2}$, whereby a desired junction comprising the p type substrate 41 and the n type layer 42 is produced in the transfer channel as shown in FIG. 15(*a*).

Next, a gate oxide film 43 desired for the transfer channel is produced on the entire surface of the substrate and, thereafter, a nitride film 44 (for example, SiN film) is produced on a region corresponding to the transfer channel region. Then, first conductivity type (p type) impurities are implanted into the horizontal channel region in a dosage of $5.0\times10^{11}$ to $3.0\times10^{12}$ $cm^{-2}$ using the photoresist 45, which is used for patterning the nitride film 44, as a mask, thereby to make the impurity concentration of the horizontal channel 42*a* lower than that of the transfer channel region 46. Thereafter, an oxidation is performed with the remaining the nitride film 44 thereby to make the gate insulating film on the horizontal channels thicker than that on the transfer channel as shown in FIG. 15(*c*). Then, the gate electrodes are produced without removing the oxide film 43, resulting in the construction shown in FIG. 12.

Still another production method of the charge coupled device according to the second embodiment will be described with reference to FIGS. 16(*a*)–16(*c*).

First of all, second conductivity type (n type) impurities are implanted into a region corresponding to a transfer channel and first and second horizontal channels on a first conductivity type (p type) semiconductor substrate 71 in a dosage of approximately $5\times10^{11}$ to $2\times10^{12}$ $cm^{-2}$, thereby to produce an $n^-$ type layer 72. Then, an appropriate annealing is applied thereto and a desired junction for the horizontal channel regions 5 and 6 as shown in FIG. 16(*a*) is produced in the whole region.

Next, a gate oxide film 73 having a thickness desired for the horizontal channels is produced on the substrate, and a photoresist is deposited on the gate oxide film 73. Then, the photoresist 75 is patterned so as to have an aperture at a portion corresponding to the transfer channel region as shown in FIG. 16(*b*).

Next, the gate oxide film 73 on the transfer channel region is removed by an anisotropic etching method such as RIE using the photoresist 75 as a mask. Thereafter, second conductivity type (n type) impurities are implanted using the photoresist 75 as a mask, thereby to produce a desired junction for the transfer channel region as shown in FIG. 16(*c*).

Figures 16A, 16B, 16C:
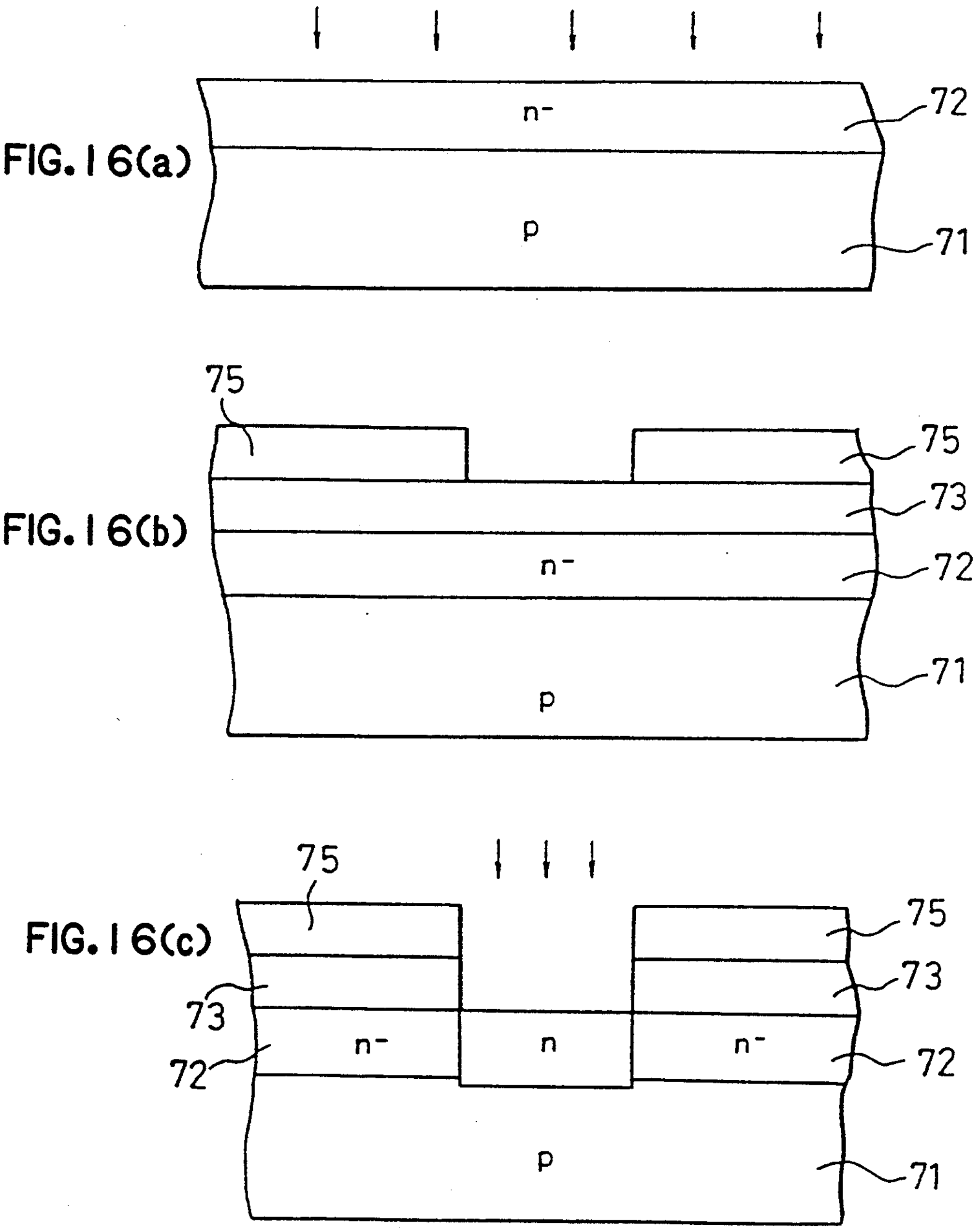
FIGS. 16(*a*) to 16(*c*) are cross-sectional views showing still another production method of the charge coupled device of FIG. 12.

Thereafter, although it is not shown in FIG. 16(*c*), oxidation is performed so as to produce a gate oxide film having a desired thickness desired for the transfer channel region on the substrate surface, and gate electrodes are produced without removing these gate oxide films, resulting in the construction of FIG. 12.

Next, a charge coupled device according to a third embodiment of the present invention will be described with reference to FIG. 17.

Figure 17:
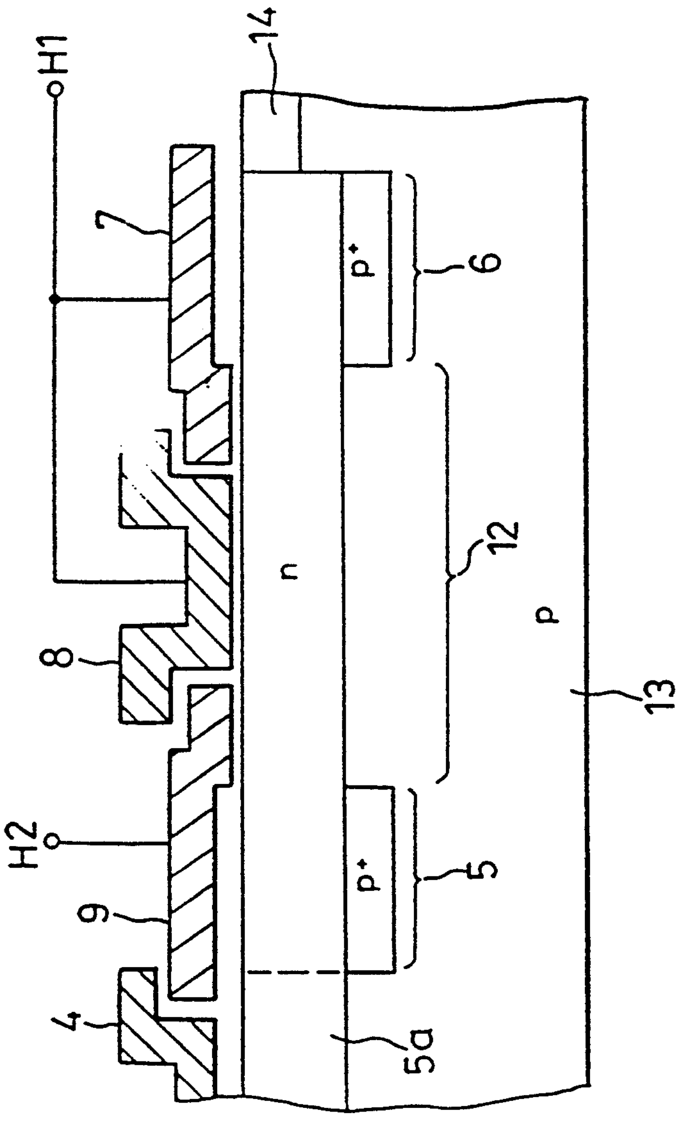
FIG. 17 is a cross-sectional view taken along a line II—II of FIG. 1 in accordance with a third embodiment of the present invention.

In FIG. 17, the same reference numerals as those shown in FIGS. 2 and 12 designate the same or corresponding parts. In this third embodiment, the transfer channel 12 and the first and second horizontal channels 5 and 6 have the same second conductivity type (n type in FIG. 17) impurity concentration and the same junction depth, and the concentration of the first conductivity type (p type in FIG. 17) semiconductor substrate of the transfer channel is lower than that of the horizontal channels. Generally, in the BCCD having the same buried channel parts, the potential of the buried channel region is shallower and the gate voltage leading to the pinning is smaller in its absolute value, i.e., less negative, as the substrate concentration is higher. Accordingly, in the device shown in FIG. 17, the pinning potential of the horizontal channels is shallower than that of the transfer channel.

In addition, in the device of FIG. 17, the insulating films between the transfer channel and the gate electrodes are thinner than the insulating films between the horizontal channels and the gate electrodes. Generally, in the BCCD, as the gate insulating film become thicker, the gate voltage leading to the pinning is larger in its absolute value, i.e., more negative, although the pinning potential value does not change. Accordingly, in the device of FIG. 17, when the thickness of the gate insulating film on the horizontal channel region is made thicker than that on the transfer channel region, the gate voltage leading to the pinning of the horizontal channels can be made larger in its absolute value, i.e., more negative, than that of the transfer channel because the substrate concentration of the transfer channel region is different from that of the horizontal channel region.

This can be also represented by a calculation on a completely depleted model utilizing a one-dimensional step junction approximation. When the substrate concentration $N_A$ is approximately $1\times10^{15}$ cm$^{-3}$, a pinning start voltage $V_{pin}$ of approximately −2.4 V, a pinning potential of 4.6 V and a potential of 6.4 V at $V_G=0$ V are obtained in a transfer channel when the gate oxide film provided on the transfer channel is approximately 150 angstroms thick, the concentration of the buried channel $N_O$ is approximately $5.5\times10^{16}$ cm$^{-3}$ and the junction depth of the transfer channel is 0.4 micron.

On the other hand, when the same buried channel as the above-described transfer channel is used as the horizontal channels, the concentration of the semiconductor substrate under the horizontal channel is $1.1\times10^{16}$ cm$^{-3}$, a high concentration p type region of 0.5 micron depth exists therein, and the gate oxide film on the horizontal channels is 1500 angstroms thick, a pinning start voltage of approximately −13 V, a pinning potential of 2.1 V and a potential of 11 V at $V_G=0$ V are obtained. That is, the relationships represented by the dotted line and the solid line of FIG. 5 can be obtained for the transfer channel and the horizontal channels. Accordingly, also in this third embodiment, the charge transfer operation can be performed in a similar manner as above-described first and second embodiments.

Next, a production method of the charge coupled device according to the third embodiment will be described with reference to FIGS. 18(*a*)–18(*c*).

Figure 18A:
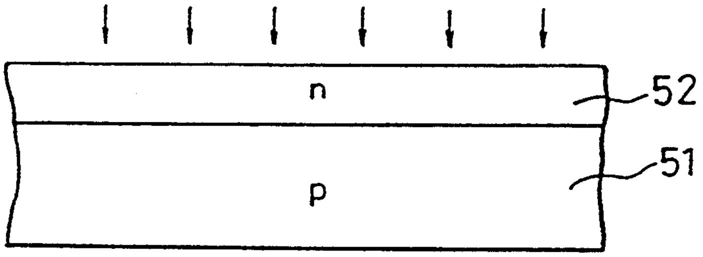
FIGS. 18(*a*) to 18(*c*) are cross-sectional views showing a production method of the charge coupled device of FIG. 17.
Figure 18B:
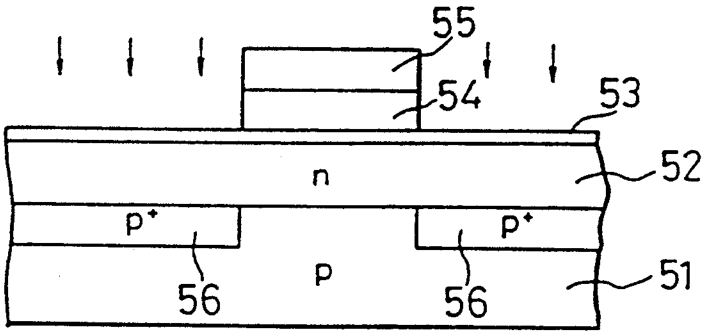
Figure 18C:
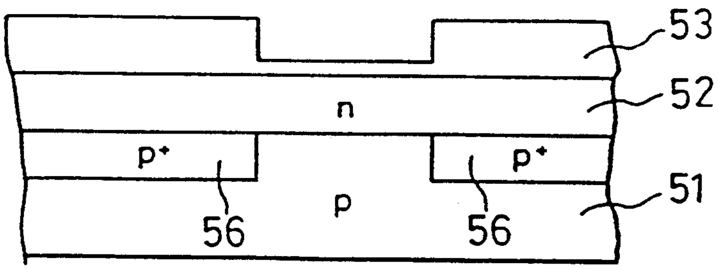

First of all, an n type impurity layer 52 which corresponds to the horizontal channels and the transfer channel is produced on the p type substrate 51 as shown in FIG. 18(*a*).

Next, as show in FIG. 18(*b*), a gate oxide film 53 having a desired thickness for the transfer channel is produced on the entire surface and, thereafter, an insulating film 54 (for example, a nitride film) is produced on a region corresponding to the transfer channel region. Then, p type impurities are implanted at high energy so as to be implanted into a portion deeper than the n type impurity layer 52 using the photoresist 55, which is used for patterning the insulating film 54, as a mask. As for the implantation energy, 200 keV to 1000 keV is suitable. Thus, a p type substrate region 56 having a higher concentration than the p type substrate in the transfer channel region is produced in the horizontal channel region.

Thereafter, an oxidation is performed the remaining insulating film 54 thereby to make the gate oxide film on the horizontal channels thicker than that on the transfer channel as shown in FIG. 18(*c*). Then, the gate electrodes are produced with the remaining oxide film 53, resulting in a desired structure.

Another production method of the charge coupled device according to the third embodiment will be described with reference to FIGS. 19(*a*)–19(*c*).

First of all, second conductivity type (n type) impurities are implanted into a region corresponding to a transfer channel and first and second horizontal channels on a first conductivity type (p type) semiconductor substrate 61 in a dosage of approximately $1\times10^{12}$ to $1\times10^{13}$ cm$^{-2}$, thereby to produce an n type layer 62. An appropriate annealing can be applied thereto if necessary. Then, first conductivity type (p type) impurities are implanted into the region corresponding to a transfer channel and first and second horizontal channels at a high energy so as to be implanted into a portion deeper than the n type layer, thereby producing a p+ type impurity layer 66 as shown in FIG. 19(*a*). In a case where boron ions are used as the p type impurities, they may be implanted at an energy of 200 to 1000 keV in a dosage of approximately $5\times10^{11}$ cm$^{-2}$ to $5\times10^{13}$ cm$^{-2}$.

Next, a gate oxide film 63 having a desired thickness for the horizontal channel region is produced on the substrate, and a photoresist 65 is deposited on the gate oxide film 63. Then, the photoresist 65 is patterned so as to expose the gate oxide film 63 on the transfer channel region as shown in FIG. 19(*b*).

Next, the gate oxide film 63 on the transfer channel region is removed by an anisotropic etching method such as RIE using the photoresist 65 as a mask. Thereafter, second conductivity type (n type) impurities are implanted at a high energy s as to make the concentration of the first conductivity type substrate of the transfer channel region lower than that of the horizontal channel region, using the photoresist 65 as a mask, as shown in FIG. 19(*c*). When phosphorous ions are used as the p type impurities, an implantation energy of 200 to 2000 keV and a dosage of $5\times10^{11}$ to $5\times10^{12}$ are suitable.

Figure 19A:
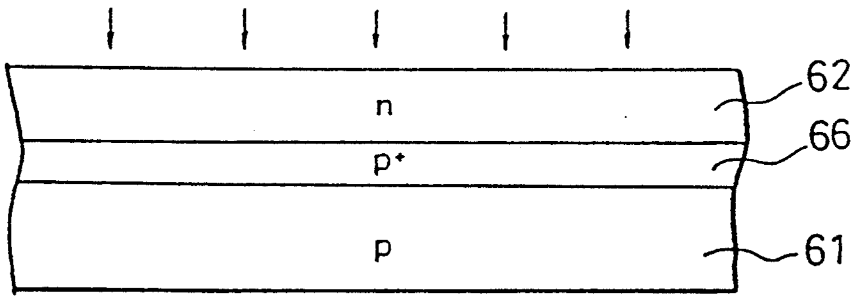
FIGS. 19(*a*) to 19(*c*) are cross-sectional views showing another production method of the charge coupled device of FIG. 17.
Figure 19B:
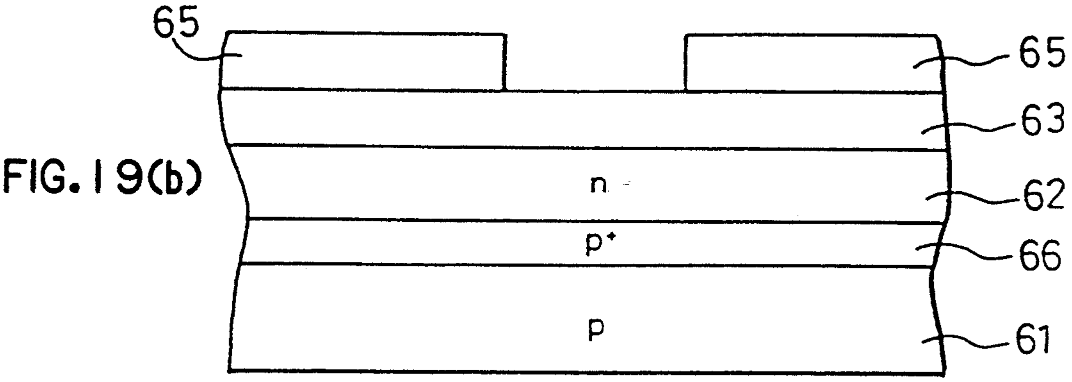
Figure 19C:
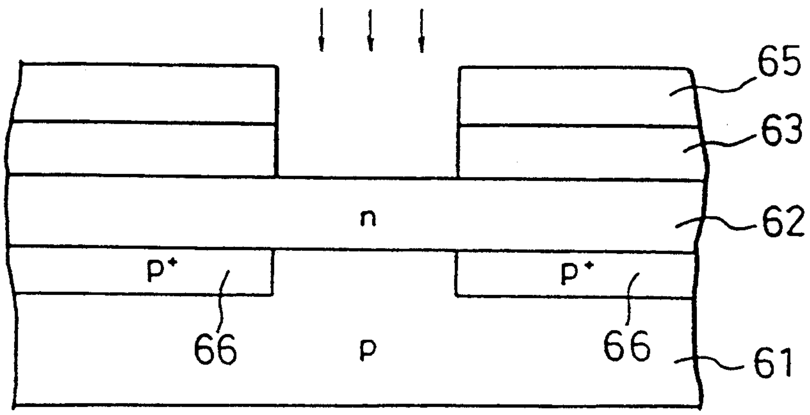
Figure 20A:
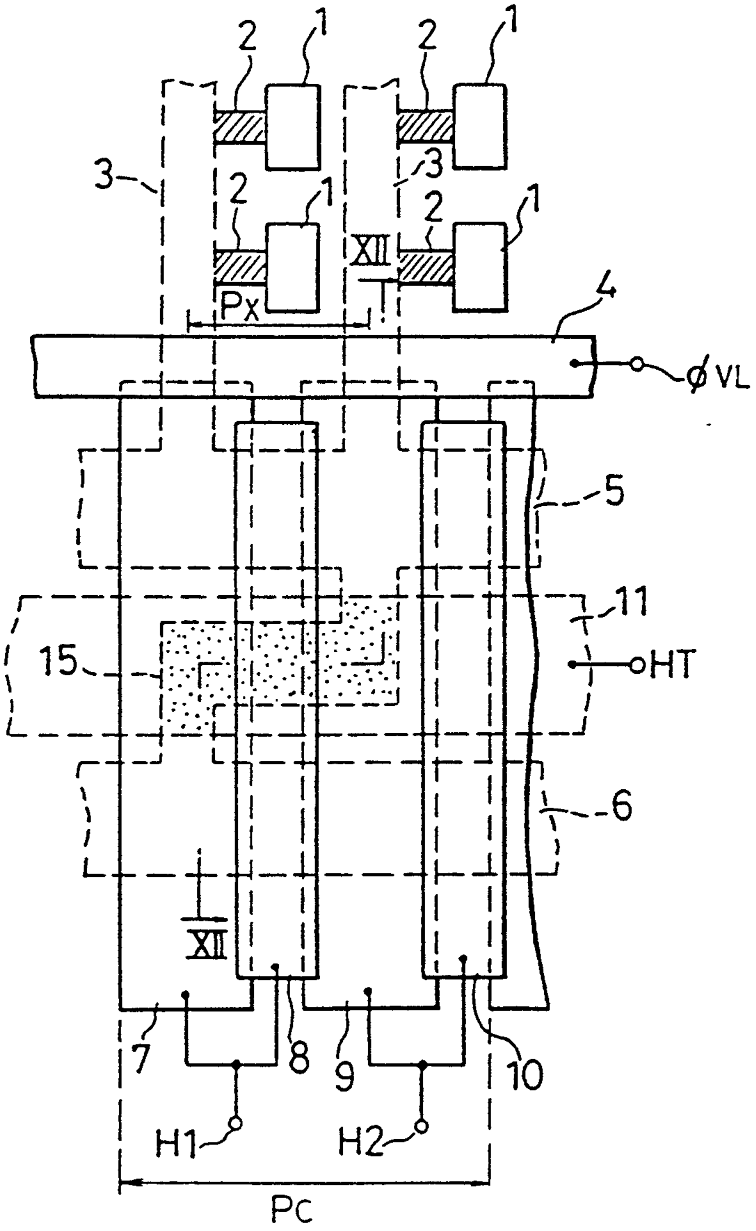
FIG.20(a) (PRIOR ART)
FIGS. 20(*a*) and 20(*b*) are a plan view and a cross-sectional view showing a conventional charge coupled device.
Figure 20B:
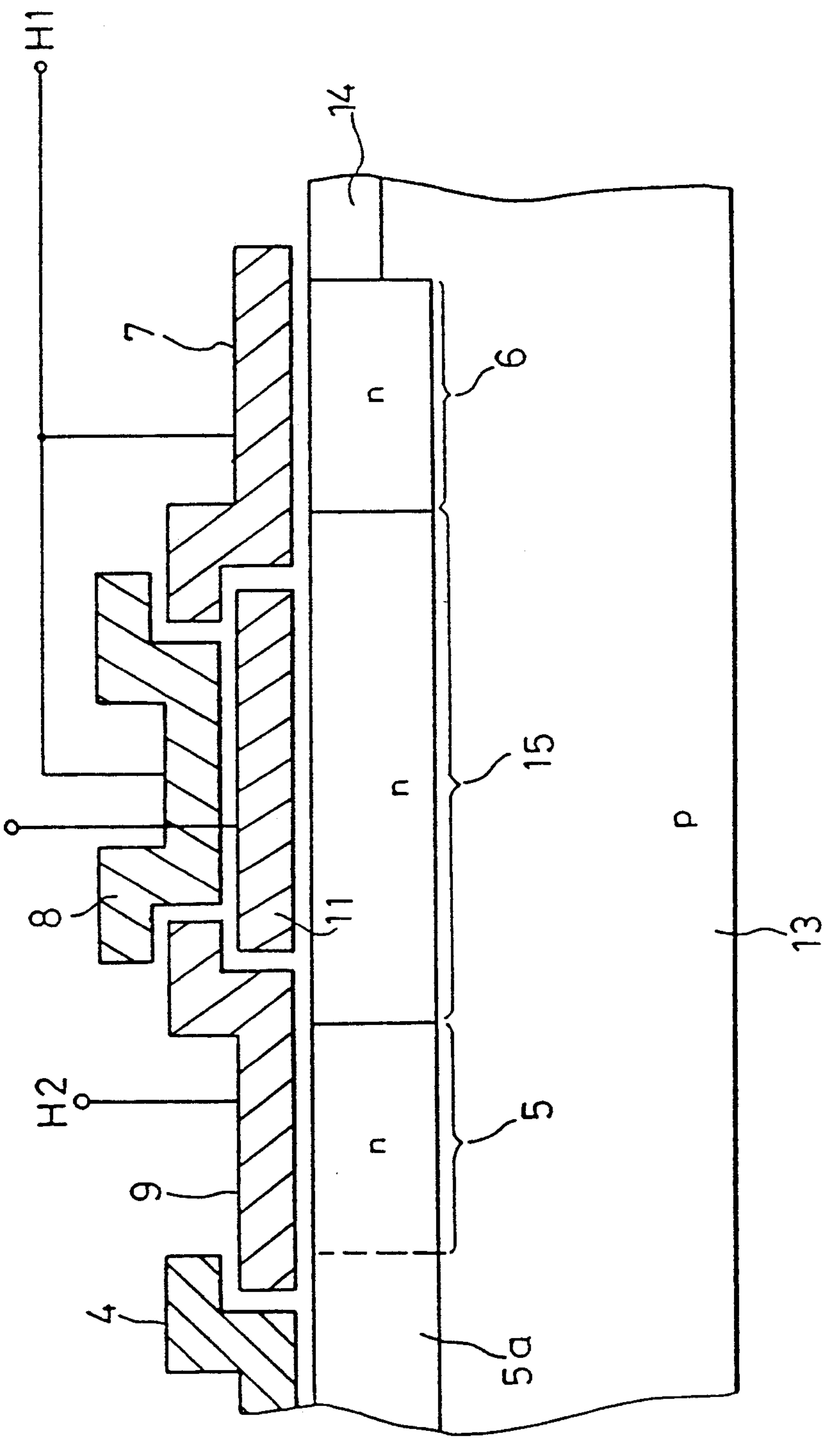
FIG.20(b) (PRIOR ART)

Thereafter, although it is not shown in FIG. 19(*c*), oxidation is performed so as to produce a gate oxide film having a desired thickness for the transfer channel region on the substrate surface, and gate electrodes are produced without removing these gate oxide films, resulting in the construction of FIG. 17.

In the above-described third embodiment, although the transfer channel and the horizontal channels comprise the same n type impurity layer, the transfer channel and the horizontal channels may comprise different kinds of n type impurity layers, since the substrate concentration of the horizontal channels is higher than that of the transfer channel.

In the above-described first to third embodiments, although a charge coupled device used for a so-called area sensor in which photo-electricity conversion parts are arranged two-dimensionally is described, the charge coupled device of the present invention can be used for a so-called linear sensor in which photo-electricity conversion parts are arranged one-dimensionally.

Figure 23:
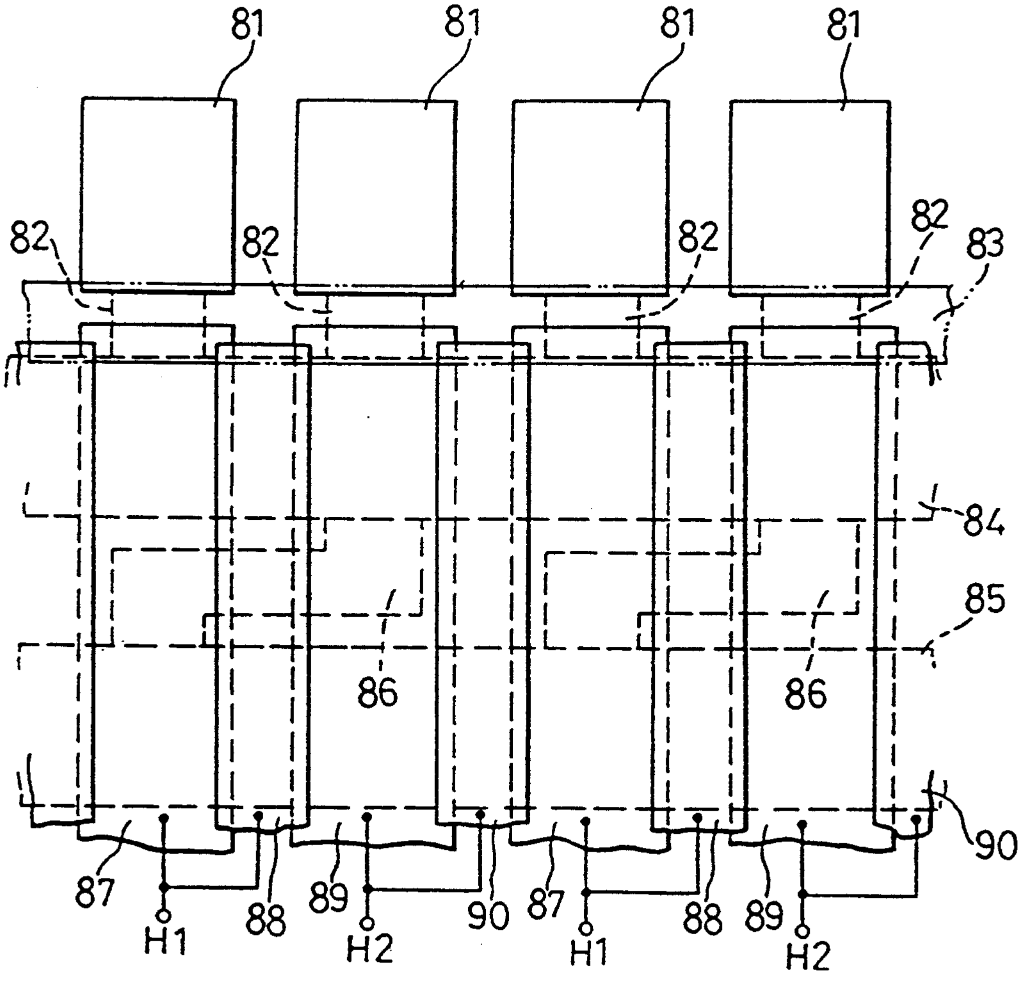
FIG. 23 is a plan view showing a charge coupled device in accordance with a fourth embodiment of the present invention.

FIG. 23 is a plan view showing such a charge coupled device used for a linear sensor in accordance with a fourth embodiment of the present invention. In FIG. 23, a plurality of photodiodes 81 are linearly arranged. A charge reading-out part 82 is provided between each photodiode 81 and a first horizontal channel 84 for reading out charges from the photodiode 81 to the first horizontal channel 84. Reference numeral 83 designates a charge reading out gate. Here, the charge reading-out part 82 may be of the first conductivity type similarly as the substrate or it may be of second conductivity type similarly as the first horizontal channel 84.

A second horizontal channel 85 is provided in parallel with the first horizontal channel 84. Transfer channels 86 for transferring charges from the first horizontal channel 84 to the second horizontal channel 85 are provided therebetween. Charge transfer gate electrodes 87 and 88 are connected with the terminal H1, and charge transfer gate electrodes 89 and 90 are connected with the terminal H2.

In this fourth embodiment, the potential of the first and second horizontal channels 84 and 85 and the potential of the transfer channel 86 have the same relations as those described in the above-described embodiments, and the same clock pulses as the above-described embodiments are applied to the terminals H1 and H2. As a result, this fourth embodiment device operates in a similar manner as the above-described embodiments.

As is evident from the foregoing description, in a charge coupled device according to the present invention, the depth of junction between a second conductivity type impurity layer serving as a transfer channel and a first conductivity type semiconductor substrate is set deeper than the depth of a junction between the second conductivity type impurity layer serving as first and second horizontal channels and the first conductivity type semiconductor substrate, and the impurity concentration of the second conductivity type impurity layer of the transfer channel is set lower than the impurity concentration of the second conductivity type impurity layers of the first and the second horizontal channels. Or, the impurity concentration of the second conductivity type impurity layer serving as the transfer channel is set higher than the impurity concentration of the second conductivity type impurity layers serving as the first and second horizontal channels, and the thickness of the insulating layer between the transfer channel and the gate electrodes is set thinner than the thickness of the insulating film between the first and second horizontal channels and the gate electrodes. Or, the impurity concentration of the first conductivity type semiconductor substrate of the transfer channel region is set lower than the impurity concentration of the first conductivity type semiconductor substrate of the first and second horizontal channel region, and the thickness of the insulating film between the transfer channel and the gate electrodes is set thinner than the thickness of the insulating film between the first and second horizontal channels and the gate electrodes. Thereby, the pinning potential of the transfer channel is larger than the pinning potential of the horizontal channels, and the gate voltage leading to the pinning of the transfer channel is smaller in its absolute value than the gate voltage leading to the pinning of the horizontal channels. Therefore, the charges in the first horizontal channel can be transferred to the transfer channel by applying a gate voltage leading to the pinning of the horizontal channels provided on the horizontal channel. Furthermore, the charges can be transferred from the first horizontal channel to the second horizontal channel by clock signals applied to the gate electrode provided on the horizontal channel. Accordingly, the control gate electrode on the transfer channel which is required in the conventional construction can be omitted, the step difference between electrodes can be eliminated and the defects such as open circuitry of respective electrodes or short-circuiting between electrodes can be prevented, resulting in a high density CCD produced at high yield.

In addition, in a production method of a charge coupled device of the present invention, since the transfer channel and the horizontal channels having above-described potential relationship are self-alignedly produced on the substrate, no potential well or potential barrier are produced between the transfer channel and the horizontal channels, resulting in a charge coupled device having good transmission characteristics.

In addition, in a production method of a charge coupled device of the present invention, since the depth of the junction of the horizontal channels is made shallow by an implantation of first conductivity type impurities, the pinning potential can be made low and the difference in the pinning potentials between the horizontal channels and the transfer channel can be made large, whereby the charge transfer can be easily performed.

What is claimed is:

1. A method of producing a charge coupled device comprising:
   - producing a first second conductivity type region in a first conductivity type substrate to form a pn junction at a first depth in said substrate;
   - producing a second second conductivity type region having a smaller impurity concentration than that of said first second conductivity type region by annealing said substrate and moving the pn junction in said substrate to a second depth deeper than the first depth;
   - implanting impurities producing the second conductivity type only in spaced apart regions and in adjacent parts of said second second conductivity type region to produce first and second horizontal channels in said substrate; and
   - implanting impurities producing the first conductivity type at such an implantation energy and dosage to change said second second conductivity type region opposite but not between each of said spaced apart first and second horizontal channels to first conductivity type regions and to move the pn junction in said substrate opposite said first and second horizontal channels but not between said first and second horizontal channels to a third depth intermediate the first and second depths.

2. A method of producing a charge coupled device comprising:
   - producing a first second conductivity type region of relatively low impurity concentration in a first conductivity type substrate;
   - forming a first gate insulating film on said substrate on said first second conductivity type region;
   - forming a mask on part of said first gate insulating film opposite a region in said substrate that will become a transfer channel separating regions in said substrate that will become first and second horizontal channels;
   - thickening said first gate insulating film opposite regions that will become said first and second horizontal channels but not at said mask to become a second insulating film;
   - removing said mask, leaving the relatively thin first gate insulating film opposite the region that will become said transfer channel and a relatively thick second insulating film opposite the regions that will become said first and second horizontal channels; and
   - implanting impurities producing the second conductivity type in said first second conductivity type region of relatively low impurity concentration through said relatively thin first gate insulating film to form said transfer channel using said relatively thick second insulating film as an ion implantation mask.

3. A method of producing a charge coupled device comprising:
   - producing a second conductivity type region in a first conductivity type substrate;
   - producing a gate insulating film on said second conductivity type region;

producing a second insulating film different from the material of said gate insulating film on said gate insulating film opposite a region in said substrate that will become a transfer channel;

implanting in said substrate impurities producing the first conductivity type using a resist pattern and said second insulating film as an ion implantation mask, thereby to produce first and second horizontal channels separated by a transfer channel in said substrate, said transfer channel being formed opposite said second insulating film; and making said gate insulating film opposite said first and second horizontal channels thicker than the thickness of said gate insulating film opposite said transfer channel.

4. A method of producing a charge coupled device comprising:

producing a second conductivity type region in a first conductivity type semiconductor substrate thereby to produce a junction desired for horizontal channels;

producing a gate insulating film on said semiconductor substrate;

depositing photoresist and patterning said photoresist on said gate insulating film to include an aperture at a region corresponding to a transfer channel region;

removing said gate insulating film from said transfer channel region by anisotropic etching; and implanting impurities producing the second conductivity type using said photoresist as a mask, thereby to produce a desired junction in said transfer channel region, wherein the pinning potential of said transfer channel is larger in absolute value than the pinning potential of said horizontal channels and the gate voltage pinning said transfer channel is smaller in absolute value than the gate voltage pinning said horizontal channels.

5. The method of claim 3 including implanting impurities producing the first conductivity type with sufficiently high energy to produce first conductivity type regions in said substrate adjacent said second conductivity type first and second horizontal channels and having a higher dopant impurity concentration than said first conductivity type substrate.

6. The method of claim 4 including, after producing the second conductivity type region and before producing the gate insulating film, implanting ions producing the first conductivity type in said substrate adjacent the second conductivity type region whereby, after implanting second conductivity type impurities to produce said transfer channel region, second conductivity type regions having impurity concentrations exceeding the impurity concentration of the substrate remain adjacent said horizontal channels.

* * * * *